(12) United States Patent
Liao et al.

(10) Patent No.: US 10,008,530 B2
(45) Date of Patent: Jun. 26, 2018

(54) IMAGE SENSING DEVICE AND MANUFACTURING METHOD THEREOF

(71) Applicant: TAIWAN SEMICONDUCTOR MANUFACTURING COMPANY LTD., Hsinchu (TW)

(72) Inventors: Keng-Ying Liao, Tainan (TW); Chung-Bin Tseng, Tainan (TW); Cheng-Hsien Chou, Tainan (TW); Jiech-Fun Lu, Tainan (TW); Po-Zen Chen, Tainan (TW); Yi-Hung Chen, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days. days.

(21) Appl. No.: 14/610,049

(22) Filed: Jan. 30, 2015

(65) Prior Publication Data
US 2016/0225813 A1    Aug. 4, 2016

(51) Int. Cl.
*H01L 27/146* (2006.01)

(52) U.S. Cl.
CPC ...... *H01L 27/1463* (2013.01); *H01L 27/1464* (2013.01); *H01L 27/14623* (2013.01); *H01L 27/14636* (2013.01)

(58) Field of Classification Search
None
See application file for complete search history.

(56) References Cited

U.S. PATENT DOCUMENTS

| 6,028,669 A * | 2/2000 | Tzeng | G01B 11/0683 356/504 |
| 6,447,369 B1 * | 9/2002 | Moore | B24B 37/005 451/10 |
| 2011/0157599 A1 * | 6/2011 | Weaver | G01D 5/266 356/496 |
| 2013/0221410 A1 * | 8/2013 | Ahn | H01L 31/0232 257/225 |

(Continued)

OTHER PUBLICATIONS

Office action dated Aug. 4, 2016 from the Taiwan counterpart application 104138209.

(Continued)

*Primary Examiner* — Michael Lebentritt
*Assistant Examiner* — Jordan Klein
(74) *Attorney, Agent, or Firm* — WPAT, P.C., Intellectual Property Attorneys; Anthony King

(57) ABSTRACT

Some embodiments of the present disclosure provide a back side illuminated (BSI) image sensor. The BSI image sensor includes a semiconductive substrate, a deep trench isolation (DTI) at a back side of the semiconductive substrate, and a dielectric layer. the dielectric layer includes a top portion over the back side, and a side portion lined to a sidewall of the DTI. The BSI image sensor includes a planarization stop layer disposed conformally on top of the dielectric layer. The planarization stop layer includes a top section on the top portion, a side section lined against the side portion, and a first transmittance. The BSI image sensor includes a low-transparent material inside the DTI, and the low-transparent material includes a second transmittance. The second transmittance is lower than the first transmittance.

18 Claims, 34 Drawing Sheets

(56) References Cited

U.S. PATENT DOCUMENTS

| | | | |
|---|---|---|---|
| 2013/0285179 A1* | 10/2013 | Lin | H01L 27/14609 257/432 |
| 2014/0054662 A1* | 2/2014 | Yanagita | H01L 27/1463 257/291 |
| 2014/0211057 A1* | 7/2014 | Chien | H04N 5/361 348/308 |
| 2014/0252521 A1 | 9/2014 | Kao et al. | |
| 2014/0374868 A1* | 12/2014 | Lee | H01L 27/1463 257/446 |
| 2015/0091121 A1* | 4/2015 | Manda | H01L 27/14621 257/443 |
| 2015/0102448 A1* | 4/2015 | Sato | H01L 27/14634 257/446 |
| 2015/0255495 A1* | 9/2015 | Park | H01L 27/1462 257/432 |
| 2016/0049430 A1* | 2/2016 | Nomura | H01L 27/14623 257/432 |
| 2016/0112614 A1* | 4/2016 | Masuda | H01L 27/14621 348/374 |

OTHER PUBLICATIONS

Search report dated Aug. 4, 2016 from the Taiwan counterpart application 104138209.

\* cited by examiner

IMAGE SENSING DEVICE AND MANUFACTURING METHOD THEREOF

FIELD

The present disclosure relates to a method of manufacturing a back side illuminated (BSI) image sensor.

BACKGROUND

Image sensors are widely used in various imaging applications and products, such as cameras, scanners, photocopiers, etc. A performance of an image sensor is depended on a dark current. As a part of IC evolution for semiconductor image sensors, the size of pixels has been steadily reduced. As the pixels and the separation between adjacent pixels continue to shrink, issues such as excessive dark current become more difficult to control.

The dark current occurs when some electric current flows through the image sensor even no photons are entering the image sensor. The dark current is one of sources for noise in the image sensors. The dark current is referred to as a leakage current in non-optical devices such as in transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
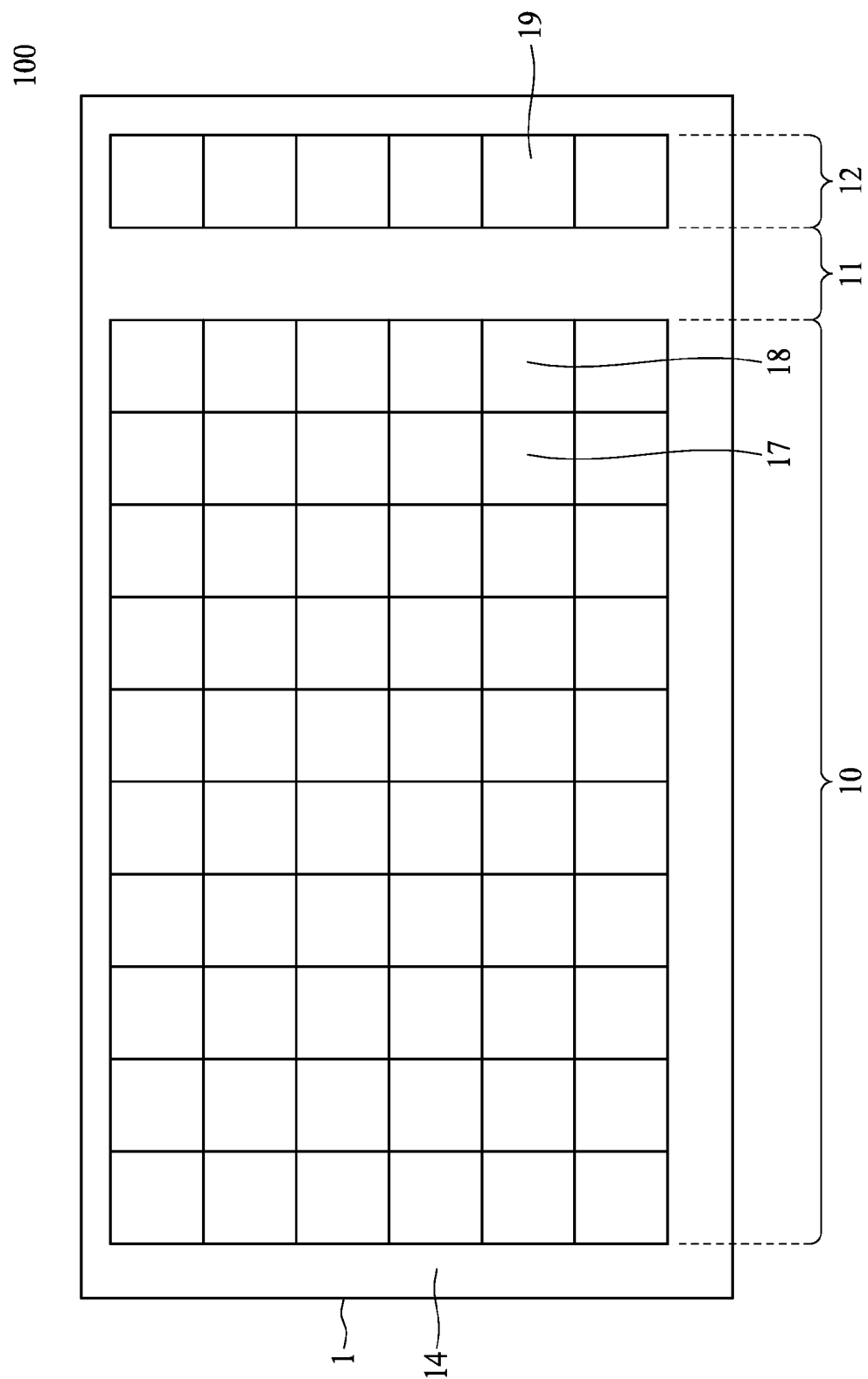
FIG. 1 is a plan view of an image sensor with some pixels, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In FIG. 1, an image sensor 100 is illustrated. FIG. 1 is a schematic plan view of an image sensor 100 in accordance with some embodiments. The image sensor 100 includes a semiconductive substrate 1. The semiconductive substrate 1 includes a pixel array region 10 and a logic region 14 outside the pixel array region 10. The pixel array region 10 includes one or more pixel regions 17 and 18 arranged therein in a pixel array. The pixel regions 17 and 18 are configured to convert light to image data. In some embodiments, the pixel array region 10 includes complementary metal-oxide-semiconductor (CMOS), and the image sensor 100 is a CMOS image sensor (CIS). In some embodiments, the pixel regions 17 and 18 are charged coupled device (CCD) image sensors. In some embodiments, the pixel regions 17 and 18 are monochromatic pixels. In some other embodiments, the pixel regions 17 and 18 are color pixels such as blue (B), green (G), or red (R) pixels configured to detect different colors in an incident light. The image sensor 100 further includes one or more black level reference pixels 19 arranged in a black level reference pixel array 12. The black level reference pixels 19 are similar or identical to the pixel regions 17 and 18, except that light is blocked to prevent the black level reference pixels 19 from receiving light. Image data outputted by the black level reference pixels 19 provides a black level that is referenced for calibrating the image sensor 100. In some embodiments, the black level reference pixels 19 are omitted.

Figure 2:
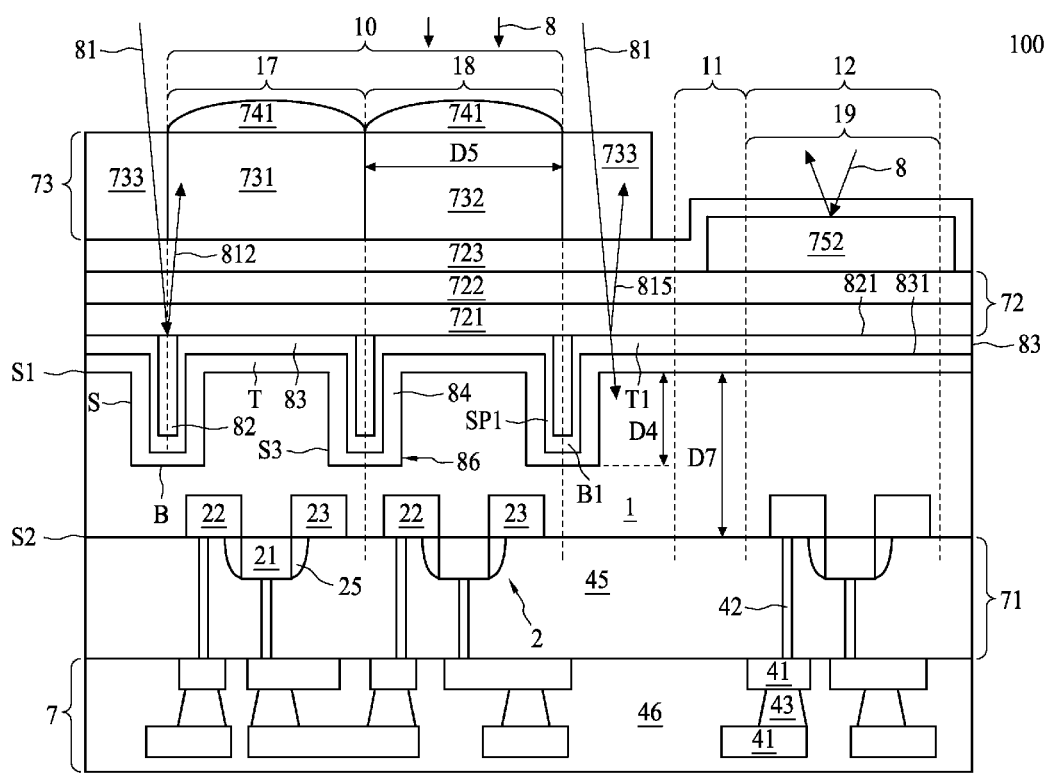
FIG. 2 is a cross-sectional view of an image sensor, in accordance with some embodiments of the present disclosure.

FIG. 2 is a cross sectional view of image sensor 100. In some embodiments, the image sensor 100 is a back side illuminated (BSI) image sensor. The image sensor 100 includes the pixel array region 10, buffer region 11, and black level reference pixel array 12.

Pixel array region 10 includes pixel region 17 and pixel region 18. The pixel regions 17 and 18 are separated by deep trench isolation DTI 86. Each pixel region 17 or 18 includes a transistor 2. The transistor 2 includes a gate structure 21, a gate spacer 25, a photosensitive element 22, and a photosensitive element 23. Pixel region 17 and pixel region 18 are defined by the deep trench isolations 86 at a boundary of pixel region 17 or 18. Semiconductive substrate 1 includes deep trench isolation (DTI) 86 at a back side S1 of the semiconductive substrate 1. DTI 86 is under back side S1. A top surface of DTI 86 is coplanar with back side S1.

Buffer region 11 is between pixel array region 10 and black level reference pixel array 12. Buffer region 11 is separating pixel array region 10 from black level reference pixel array 12 by a predetermined distance.

Black level reference pixel 19 is structured in black level reference pixel array 12. A light shielding layer 752 is under the capping layer 723. Light shielding layer 752 prevents incident light 8 reaching the light shielding layer 752 from transmitting to the photosensitive element 22 or 23. The photosensitive element 22 or 23 is coupled with the transistor 2. The black level reference pixel 19 is configured to output image data from the transistor 2 to a logic transistor (not shown) through the contacts 42 and the interconnection 41.

Image sensor 100 includes multilayer structure 72 above semiconductive substrate 1. Color filter array 73 is above multilayer structure 72. Microlenses 741 are above color filter array 73. Image sensor 100 includes interlayer dielectric (ILD) layer 71 below semiconductive substrate 1. Redistribution layer 7 is below ILD layer 71.

The multilayer structure 72 includes a first transmitting layer 721, a second transmitting layer 722, and a capping layer 723. In some embodiments, the multilayer structure 72 includes a single layer such as transmitting layer 721. The multilayer structure 72 is disposed over the back side S1 of the semiconductive substrate 1. Transmitting layer 721 is on top of top section T1 of planarization stop layer 83. Top section T1 is positioned in between a transmitting layer 721 and a top portion T of the dielectric layer 84. A bottom surface of transmitting layer 721 is in contact with a top surface of low-transparent material 82 within the DTI 86.

In some embodiments, the pixel array region 10 includes color filter 731, 732, or 733 in color filter array 73 disposed proximate to back side S1 of the semiconductive substrate 1. The back side S1 is opposite of the front side S2. In some other embodiments, the multilayer structure 72 is arranged with an increasing refractive index from air outside the image sensor 100 to the semiconductive substrate 1. For example, color filter array 73 includes lower refractive index than a material in an underlying multilayer structure 72. Microlenses 741 include lower refractive index than a material in an underlying color filter array 73.

In an embodiment, the semiconductive substrate 1 is made from silicon. The semiconductive substrate 1 includes bulk silicon, a semiconductor wafer, a silicon-on-insulator (SOI) substrate, or a silicon germanium substrate. Other semiconductor materials including group III, group IV, and group V elements are used in some embodiments. The semiconductive substrate 1 is undoped in some embodiments. In some other embodiments, the semiconductive substrate 1 is doped with a p-type dopant or an n-type dopant. Back side S1 is at a top of the semiconductive substrate 1. Front side S2 is at a bottom of the semiconductive substrate 1.

Dielectric layer 84 is over the back side S1 of the semiconductive substrate 1. Dielectric layer 84 is within DTI 86. Dielectric layer 84 is in contact with a side S3 of the DTI 86. Side S3 is a sidewall of DTI 86. Side S3 is at an outer edge of DTI 86. In some embodiments, side S3 of DTI 86 is substantially vertical. In some other embodiments, side S3 is tilted with respect to back side S1. Back side S1 is an interface between dielectric layer 84 and semiconductive substrate 1. Top portion T of dielectric layer 84 is on top of back side S1 of semiconductive substrate 1.

A planarization stop layer 83 is disposed conformally following a contour of the dielectric layer 84 on top of the dielectric layer 84. Low-transparent material 82 is in the DTI 86 and borders with planarization stop layer 83. Planarization stop layer 83 includes a first transmittance. Low-transparent material 82 includes a second transmittance. In some embodiments, a transmittance is a transmittance for incident light 81. Incident light 81 includes a predetermined wavelength. Incident light 81 is for detecting different optical properties of different materials hitting by incident light 81. Different materials such as planarization stop layer 83 and low-transparent material 82 have different optical properties such as transmittance or reflectance. For example, a transmittance is a fraction of incident light 81 with the predetermined wavelength that passes through a medium such as planarization stop layer 83 or low-transparent material 82. In some embodiments, the first transmittance is larger than the second transmittance such that a transparency of the dielectric layer 84 is better than a transparency of the planarization stop layer 83 at the predetermined wavelength. The first transmittance and the second transmittance are configured to distinguish different optical properties between the planarization stop layer 83 and the low-transparent material 82. The optical properties also include intensity, wavelength, phase, polarity, or interference of a reflected light 815 from planarization stop layer 83 or reflected light 812 from low-transparent material 82. In some embodiments, incident light 81 is a laser. In some other embodiments, the optical properties include wavelength of emitted light from a material in planarization stop layer 83 or another material in low-transparent material 82.

In some embodiments, the transmittance correlates with another optical property such as a reflectance. The reflectance is a fraction of incident light that reflects from a material such as planarization stop layer 83 or low-transparent material 82. A larger reflectance means more fraction of light is reflected from the material. In some embodiments, planarization stop layer 83 includes a first reflectance, and low-transparent material 82 includes a second reflectance. The first reflectance is lower than the second reflectance such that for a same intensity of an incident light, more fraction of the incident light is reflected from low-transparent material 82 than from planarization stop layer 83. In some embodiments, planarization stop layer 83 comprises aluminum oxide. A transmittance is depended on a wavelength of light passing through the medium. In some other embodiments, the transmittance is applied for sound or electrical conductivity through a material.

Low-transparent material 82 is in contact with multilayer structure 72 near back side S1. Top section T1 of planarization stop layer 83 is substantially coplanar with a top surface of the low-transparent material 82. Low-transparent material 82 serves as an optical separation to configured pixel regions 17 and 18 such that light would keep within each individual pixel region 17 or 18. In some embodiments, low-transparent material 82 is made of a conductive material. The conductive material is configured to reflect light. Low-transparent material 82 is made of conductive materials such as aluminum, copper, titanium nitride, tungsten, titanium, tantalum, tantalum nitride, nickel silicide, cobalt silicide, other suitable materials, and/or combinations thereof. The Low-transparent material 82 functions to prevent light from one pixel region 17 makes its way into a neighboring pixel region 18, thereby causing the neighboring pixel region 18 to sense the light by transistor 2.

In some embodiments, DTI 86 is replaced by a shallow trench isolation (STI) features or a local oxidation of silicon (LOCOS) features. The DTI 86 defines and isolates various elements or regions from each other in the semiconductive substrate 1. For example, the DTI 86 isolates adjacent pixel region 17 or 18 from each other, the pixel array region 10 from black level reference pixel 19, or some components of the circuitry inside a logic region from each other etc. In some embodiments, DTI 86 is made of a dielectric material or insulator materials such as silicon oxide, silicon nitride, or silicon oxynitride. In some embodiments, the DTI 86 is a multi-layer structure including layer such as a thermal oxide liner layer with silicon nitride or silicon oxide inside the thermal oxide liner layer. In some embodiments, low-transparent material 82 includes the silicon nitride or silicon oxide.

In FIG. 2, semiconductive substrate 1 includes photosensitive element 22 and photosensitive element 23 of a transistor 2 at a front side S2 of the semiconductive substrate 1. Photosensitive element 22 and photosensitive element 23 are above the front side S2 and within semiconductive substrate 1.

In some embodiments, the photosensitive element 22 or the photosensitive element 23 are a drain region or a source region. In some embodiments, photosensitive element 22 or 23 is replaces by a doped drain or source region. Photosensitive element 22 or 23 is configured to receive light 8 (B, G or R). The light 8 is incident upon a microlens 741, transmitted through color filter array 73 and a multilayer structure 72, and traveled toward the back side S1 into the semiconductive substrate 1. The light 8 is then converted by the photosensitive element 22 or 23 into image data.

Transistor 2 is connected with the photosensitive element 22 or 23 at a front side S2 of the semiconductive substrate 1. Transistor 2 includes a gate structure 21 and gate spacer 25 below front side S2. An interconnection 41 coupled with the transistor 2 through a contact 42. In some embodiments, the transistor 2 is a transfer transistor for transferring the image data captured by a corresponding photosensitive element 22 or 23 to external circuitry. In some embodiments, additional transistors with various functions are also included in each pixel array region 10. Other CIS arrangements are suitable in some embodiments. The principles described herein are also applicable to CCD pixels in further embodiments. In some embodiments, other transistors in pixel array region 10 are structured similarly to the transistor 2.

The ILD layer 71 is at front side S2. ILD layer 71 is below semiconductive substrate 1. ILD layer 71 includes dielectric layer 45 below front side S2. Contacts 42 are buried inside dielectric layer 45. Contacts 42 are connected with gate structure 21, photosensitive element 22, or photosensitive element 23 of transistor 2.

Contacts 42 are connected to interconnection 41 in a redistribution layer. Redistribution layer 7 is over the dielectric layer 45 and the contacts 42 in the ILD layer 71. The redistribution layer 7 includes an interconnection 41 coupled with the contacts 42. The redistribution layer 7 includes alternating some conductive layers and some dielectric layers 46. The conductive layers are patterned and/or otherwise processed to form the interconnections 41 coupled to some devices (e.g., the transistors 2) and/or between the devices and some external circuitries. The interconnections 41 are coupled to the devices through the contacts 42. The interconnection 41 is coupled to another interconnection 41 in other layer through a via 43.

The contacts 42 are disposed in the dielectric layer 45. Contacts 42 and dielectric layer 45 are in the pixel array region 10 and the black level reference pixel array 12. The ILD layer 71 includes the contacts 42 and the dielectric layer 45. Contacts 42 are connected to photosensitive element 22 or 23 at front side S2. Contacts 42 are connected to interconnection 41 at an interface between ILD layer 71 and redistribution layer 7. The inter-layer dielectric (ILD) layer 71 is under the front side S2 of the semiconductive substrate 1. The ILD layer 71 includes dielectric layer 45 made of material such as, boron phosphorous silicate glass (BPSG), plasma enhanced tetra-ethyl-ortho-silicate (PE-TEOS), or any other suitable dielectric materials. In some embodiments, contact 42 is made of conductive materials such as aluminum, copper, titanium nitride, tungsten, titanium, tantalum, tantalum nitride, nickel silicide, cobalt silicide, TaC, TaSiN, TaCN, TiAl, TiAlN, other suitable materials, and/or combinations thereof.

Figure 3:
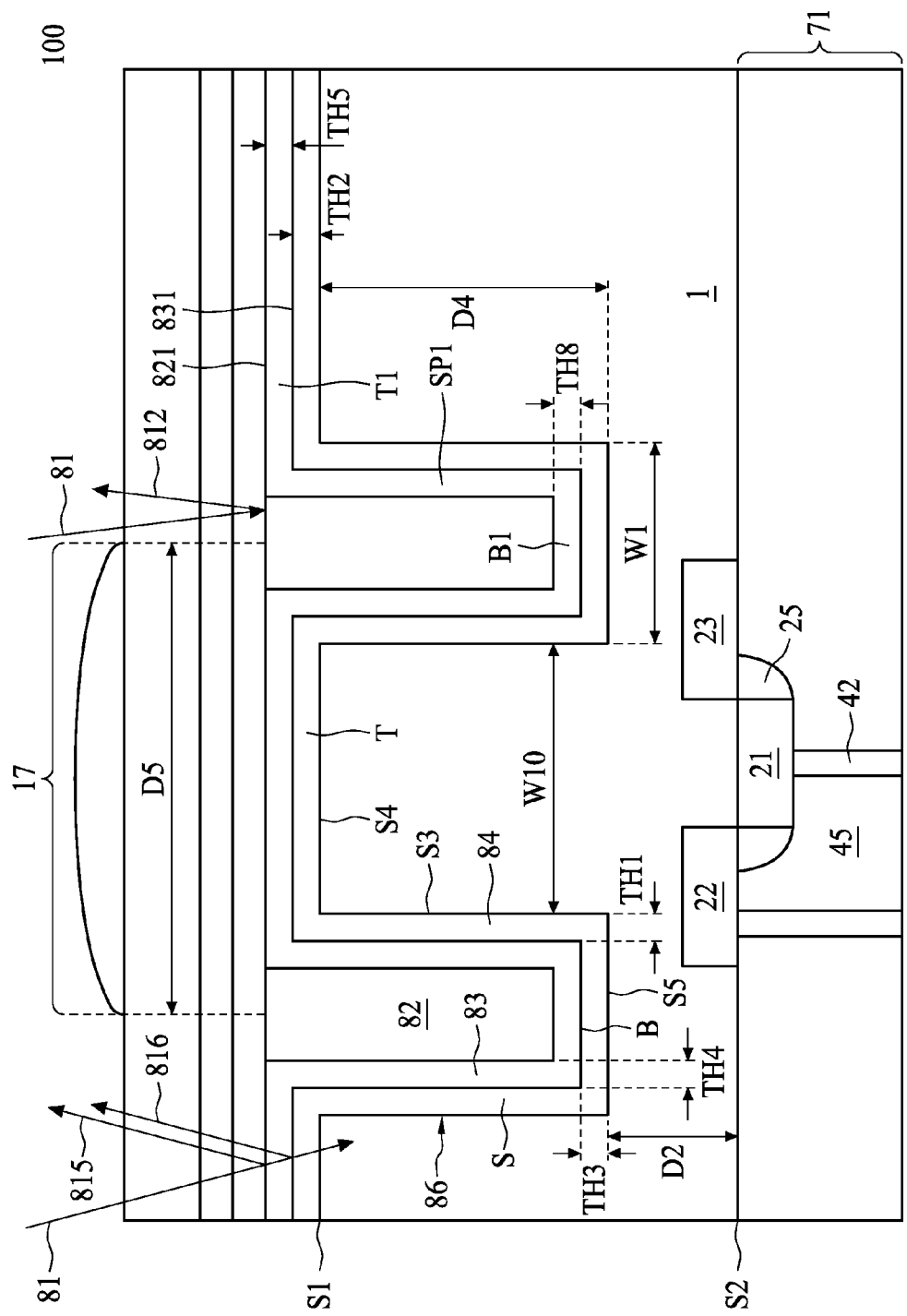
FIG. 3 is a cross-sectional view of an image sensor, in accordance with some embodiments.

FIG. 3 illustrates the embodiment in FIG. 2 in expanded view. The dielectric layer 84 includes top portion T, side portion S, and bottom portion B. In FIG. 3, planarization stop layer 83 is in between dielectric layer 84 and low-transparent material 82 inside DTI 86.

In FIG. 3, DTI 86 includes bottom side S5. A depth D4 of DTI 86 is measured from back side S1 to bottom side S5 of DTI 86. DTI 86 includes a predetermined distance D5 apart from each other. Predetermined distance D5 is measured from a center of DTI 86 to another center of a neighboring DTI 86. Predetermined distance D5 is a length of a pixel region 17. A width W1 of DTI 86 is measured from one side S3 of a DTI 86 to another side S3 of the same DTI 86. A width W10 is measured horizontally from one side S3 of a DTI 86 to another side S3 of a neighboring DTI 86. A width W1 of DTI 86 is measured from side S3 of a DTI 86 to an opposite side S3 of the same DTI 86. An aspect ratio of DTI 86 is a ratio between depth D4 and width W1.

DTI 86 includes bottom side S5 disposed at a distance D2 from the front side S2. Vertical thickness TH2 is a thickness of a top portion T of the dielectric layer 84. Vertical thickness TH2 is measured from a bottom surface S4 of dielectric layer 84 to an interface between the dielectric layer 84 and the planarization stop layer 83. Horizontal thickness TH1 is a thickness of a side portion S of the dielectric layer 84. Horizontal thickness TH1 is measured horizontally parallel to back side S1. Horizontal thickness TH1 is from a side S3 of DTI 86 to an interface between the dielectric layer 84 and the planarization stop layer 83. A ratio between vertical thickness TH2 and horizontal thickness TH1 of the dielectric layer 84 is a thickness ratio. In some embodiments, the ratio is substantially more than 1. For example, vertical thickness TH2 of top portion T is substantially greater than horizontal thickness TH1 of side portion S. Top portion T of dielectric layer 84 is proximate to the back side S1. In some embodiments, top portion T is between a DTI 86 and a neighboring DTI 86. Top portion T is overlying horizontally between multilayer structure 72 and semiconductive substrate 1. Top portion T is substantially flat on top of the semiconductive substrate 1.

In FIG. 3, side portion S of dielectric layer 84 is lined against a side S3 of DTI 86. Side portion S includes a horizontal thickness TH1. Vertical thickness TH3 is a thickness of a bottom portion B of dielectric layer 84. Vertical thickness TH3 is measured vertically from bottom side S5 to the interface between the dielectric layer 84 and the planarization stop layer 83. In some embodiments, vertical thickness TH3 of bottom portion B is substantially the same with vertical thickness TH2 of top portion T.

Planarization stop layer 83 is disposed conformally over the dielectric layer 84. Planarization stop layer 83 is lined against side portion S of dielectric layer 84 inside DTI 86. Side section SP1 of planarization stop layer 83 is in contact with in DTI 86. Planarization stop layer 83 is border on side portion S and bottom portion B of dielectric layer 84 inside DTI 86. Top section T1 of planarization stop layer 83 is on top of top portion T of dielectric layer 84 and over semiconductive substrate 1. In some embodiments, the top section T1 of the planarization stop layer 83 is substantially thinner than the top portion T of the dielectric layer 84. Side section SP1 of planarization stop layer 83 is conformally lined parallel with side portion S of dielectric layer 84 inside DTI 86. Bottom section B1 of planarization stop layer 83 is on top of bottom portion B of dielectric layer 84. Low-transparent material 82 is in contact with side section SP1 and bottom section B1 inside DTI 86. Planarization stop layer 83 is made of insulator materials such as aluminum oxide (Al2O3), silicon oxide, silicon nitride, or silicon oxynitride.

Figure 4:
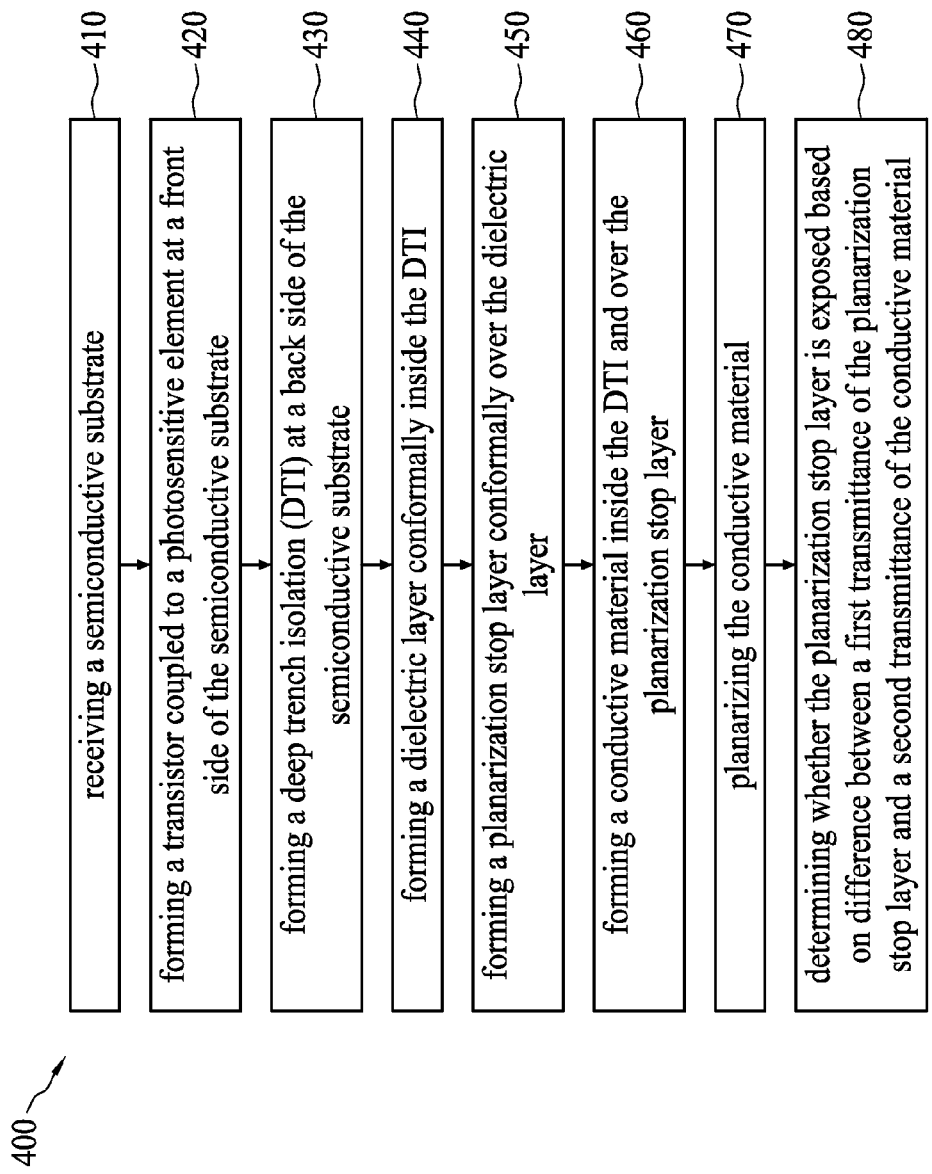
FIG. 4 is an operational flow of a method for manufacturing an image sensor, in accordance with some embodiments.
Figure 5:
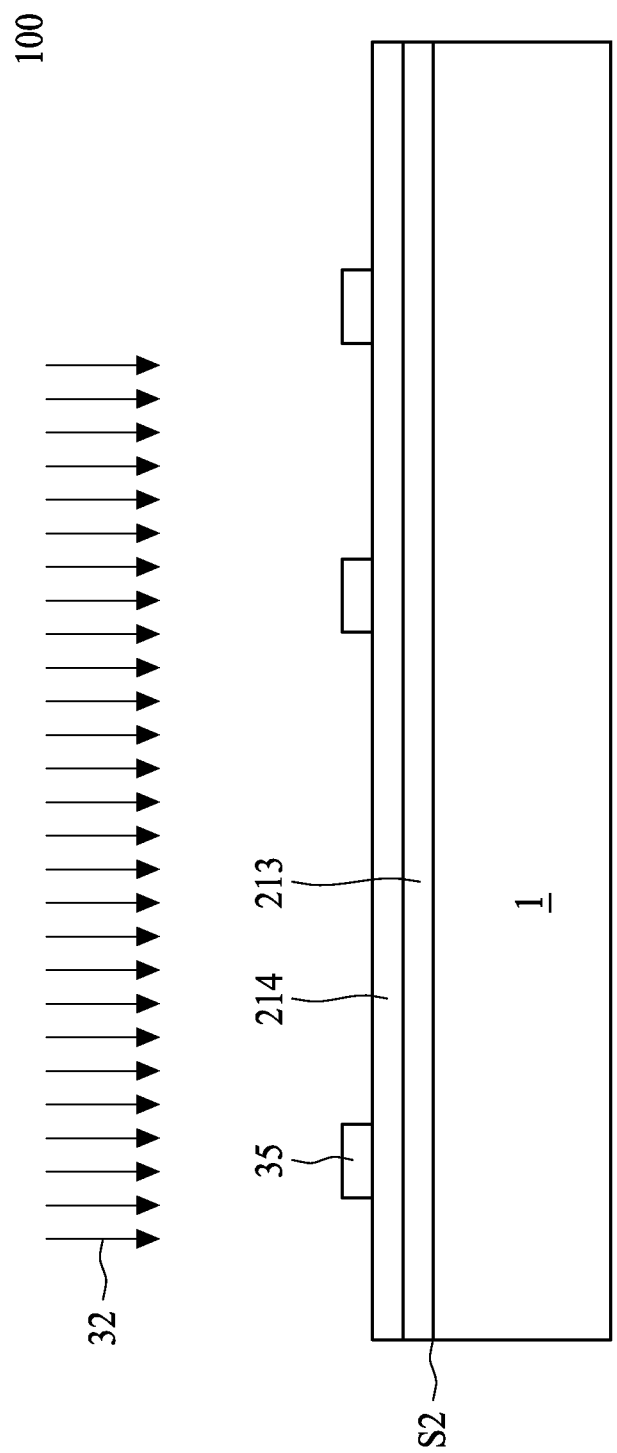
FIGS. 5 to 34 are cross sectional views of an operation in a method for manufacturing an image sensor, in accordance with some embodiments.
Figure 6:
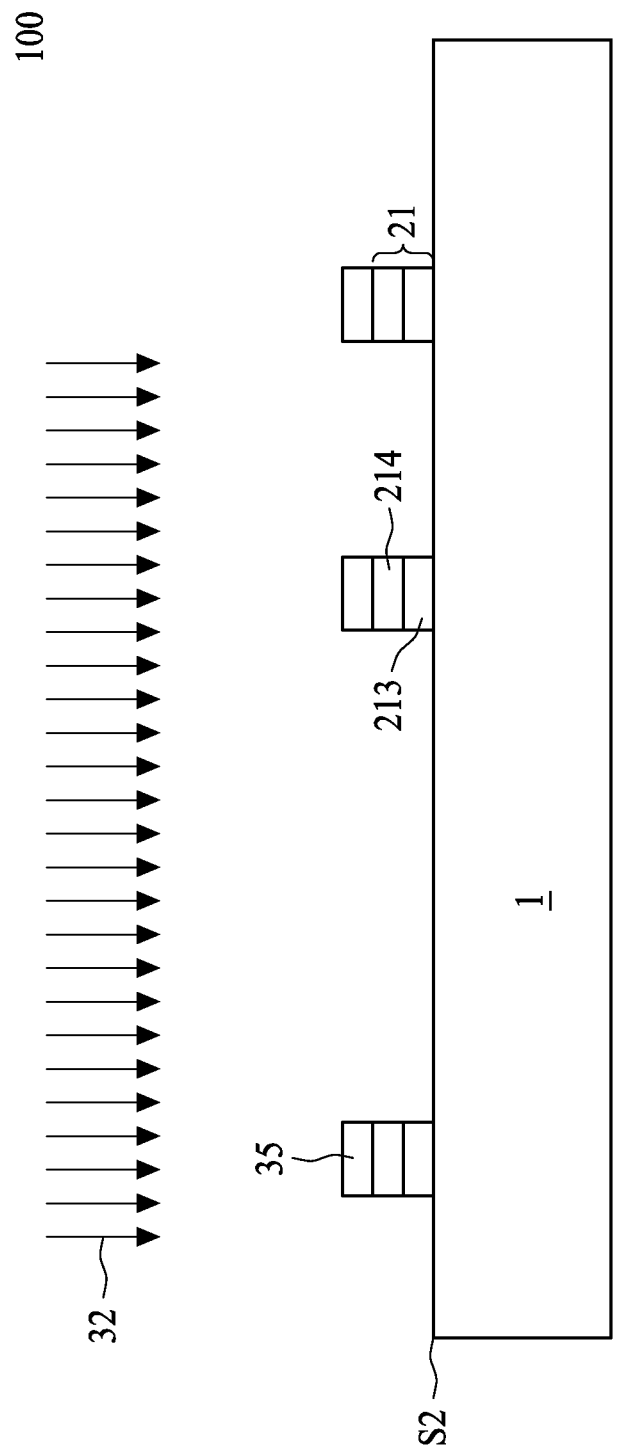
Figure 7:
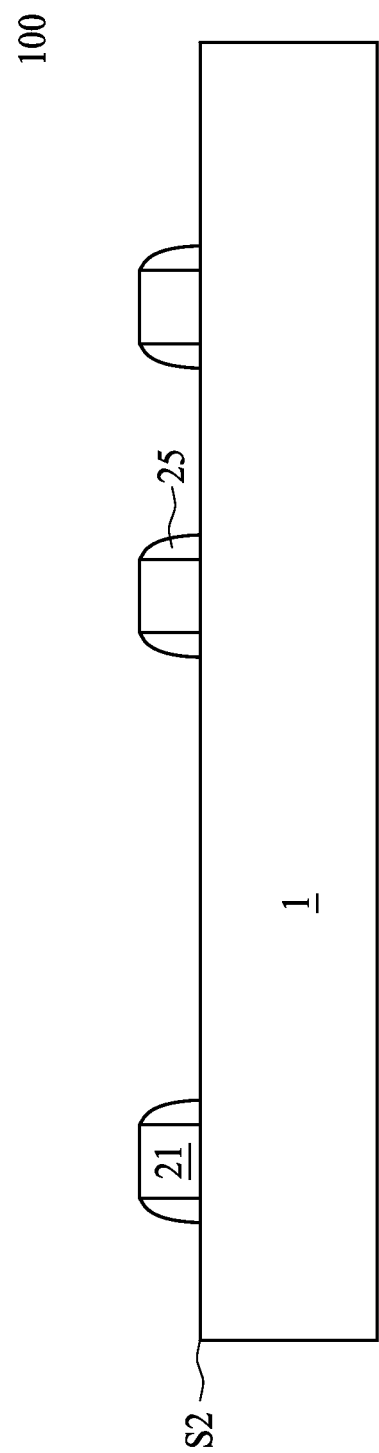
Figure 8:
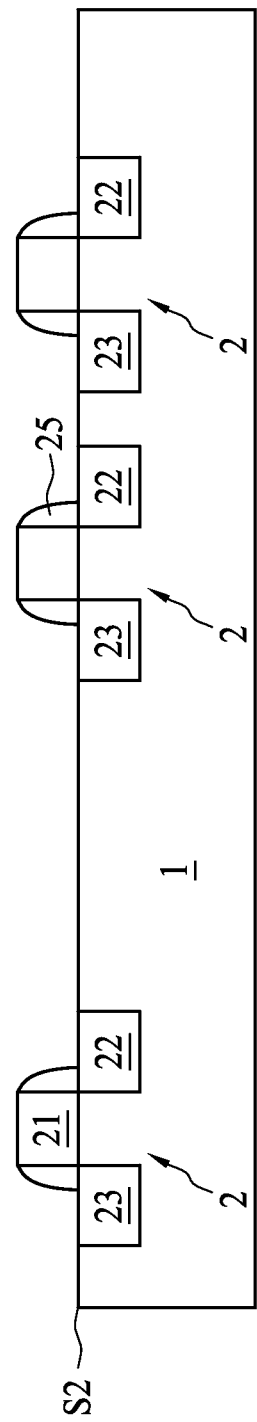
Figure 18:
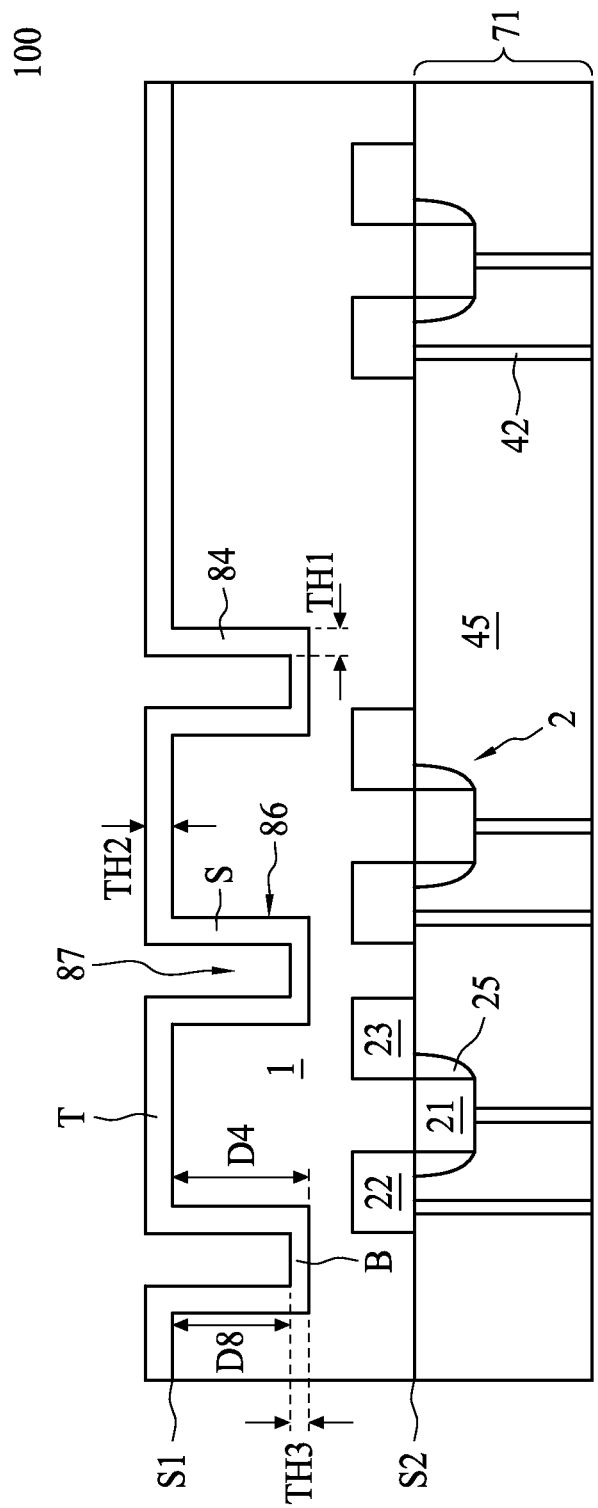
Figure 19:
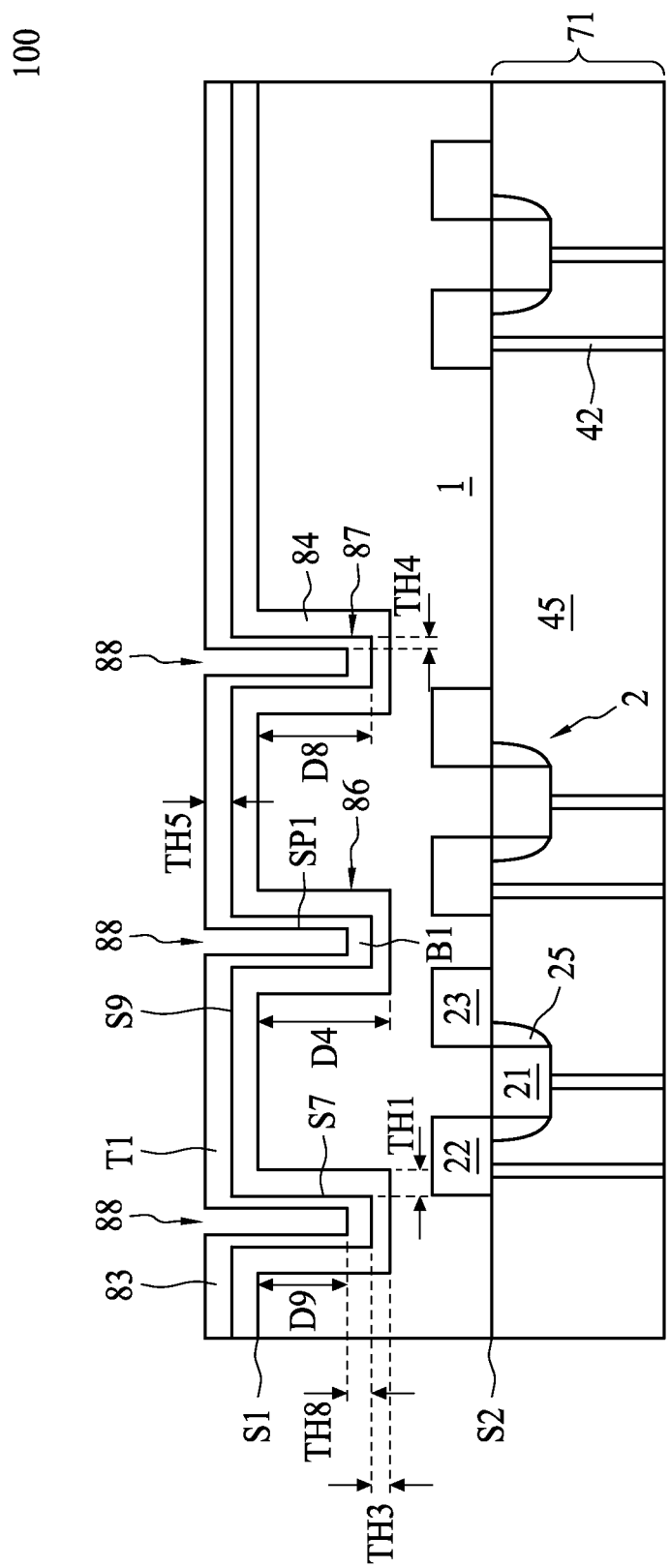
Figure 20:
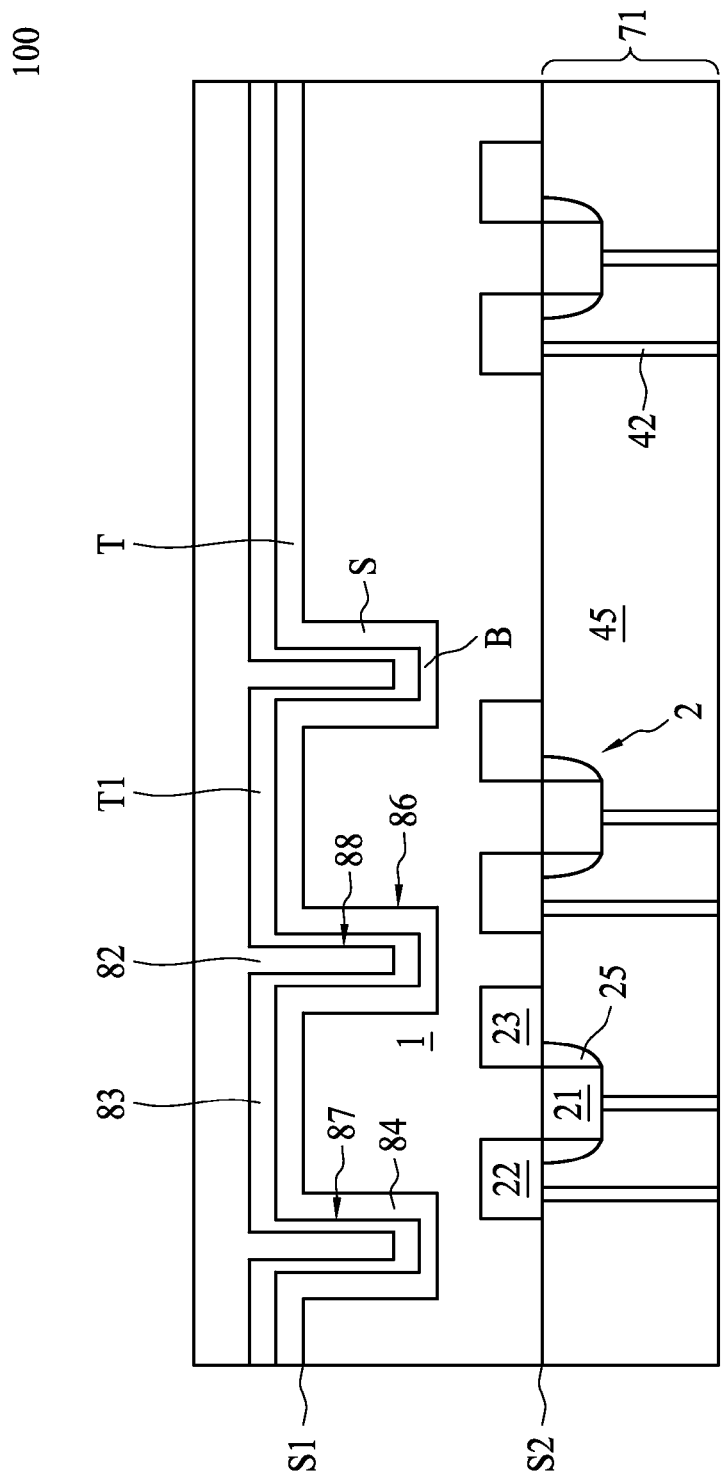
Figure 21:
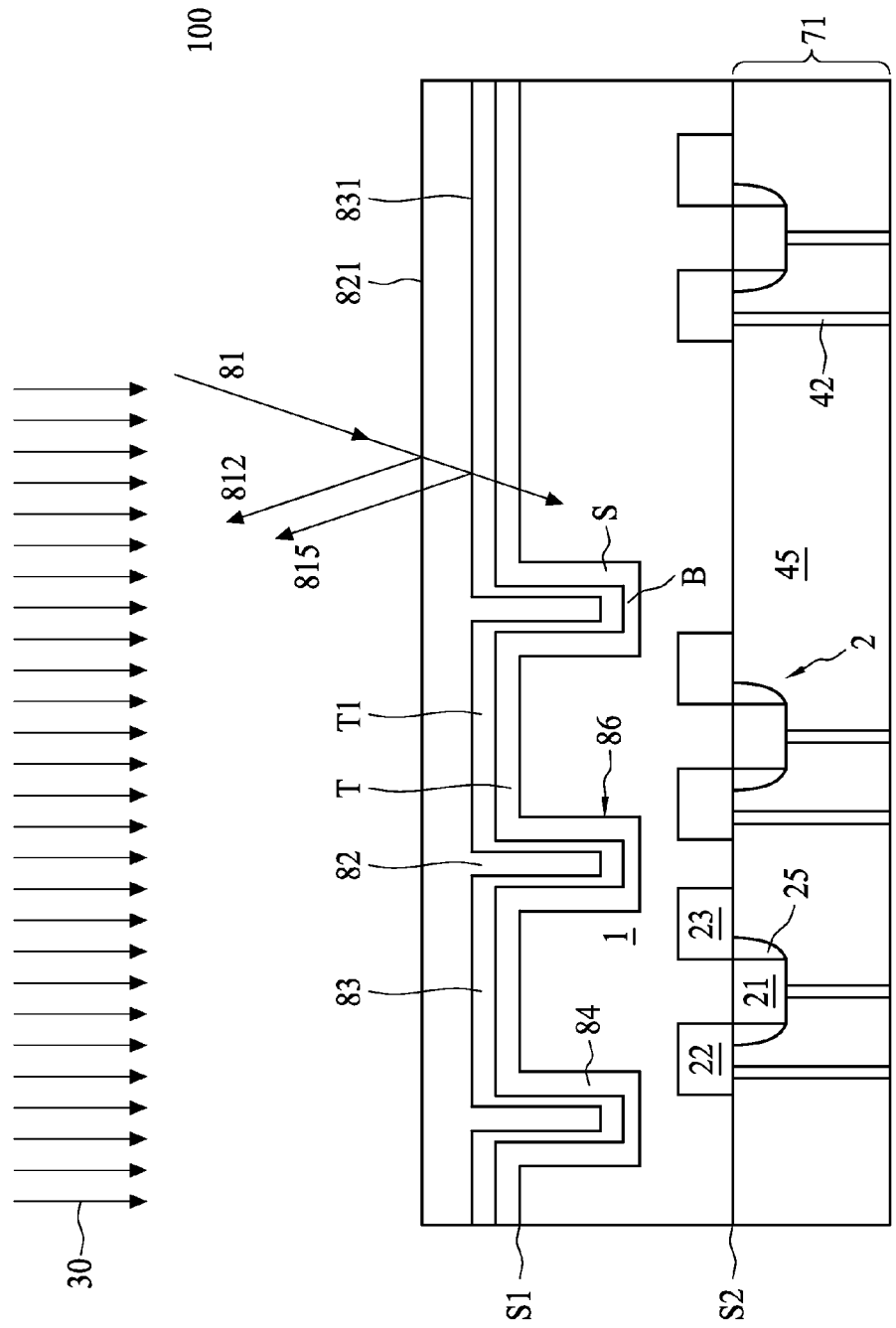
Figure 22:
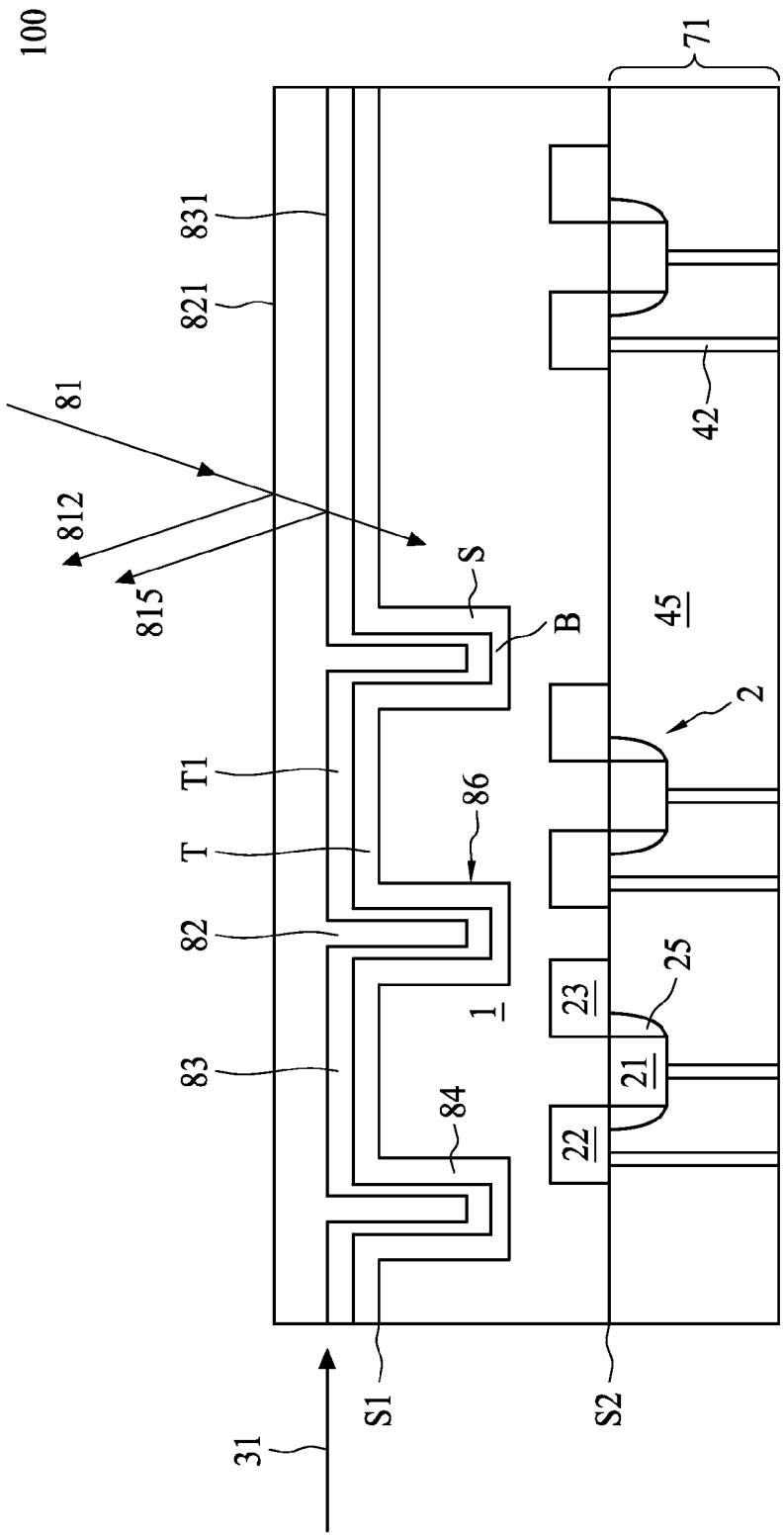
Figure 26:
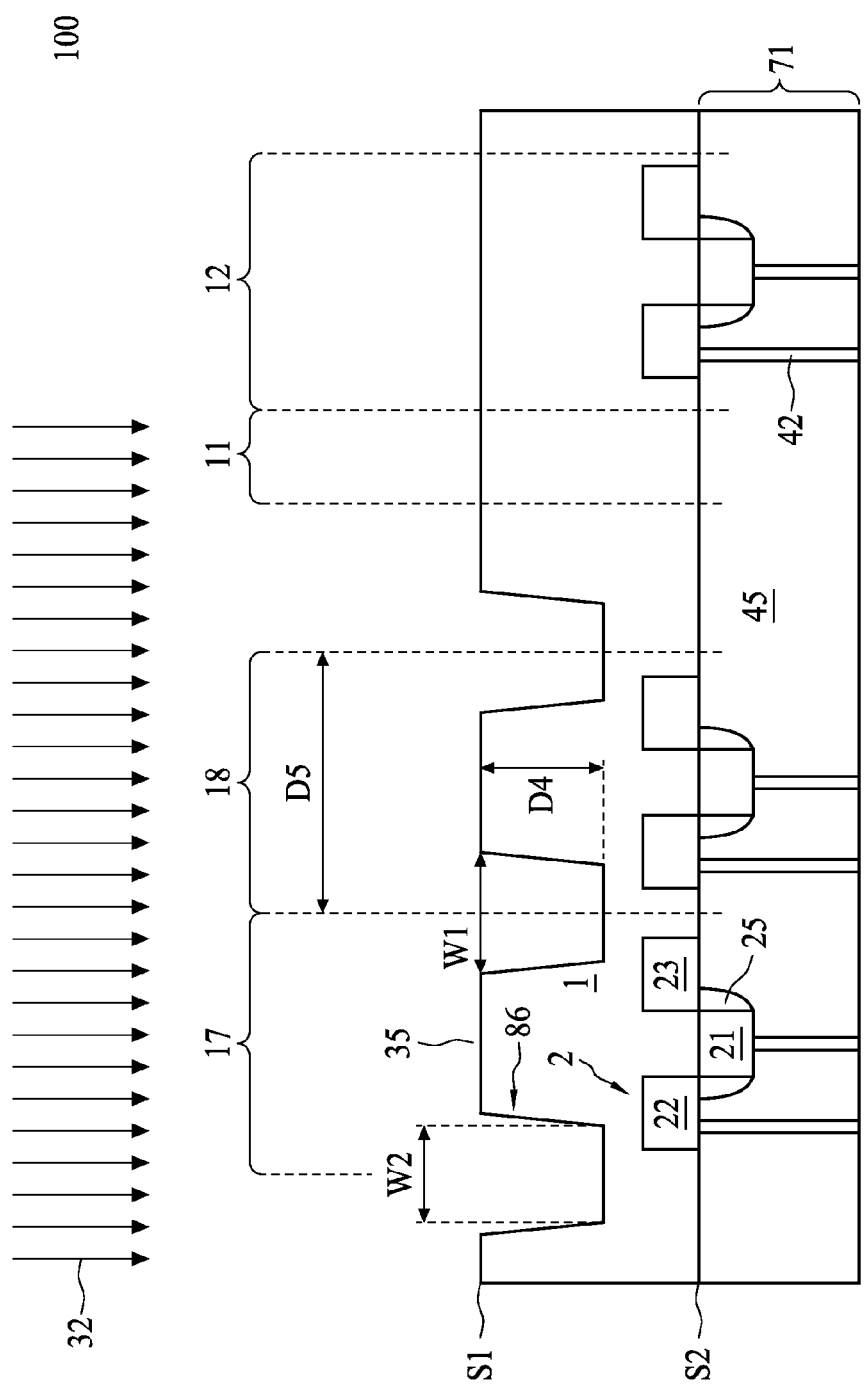
Figure 27:
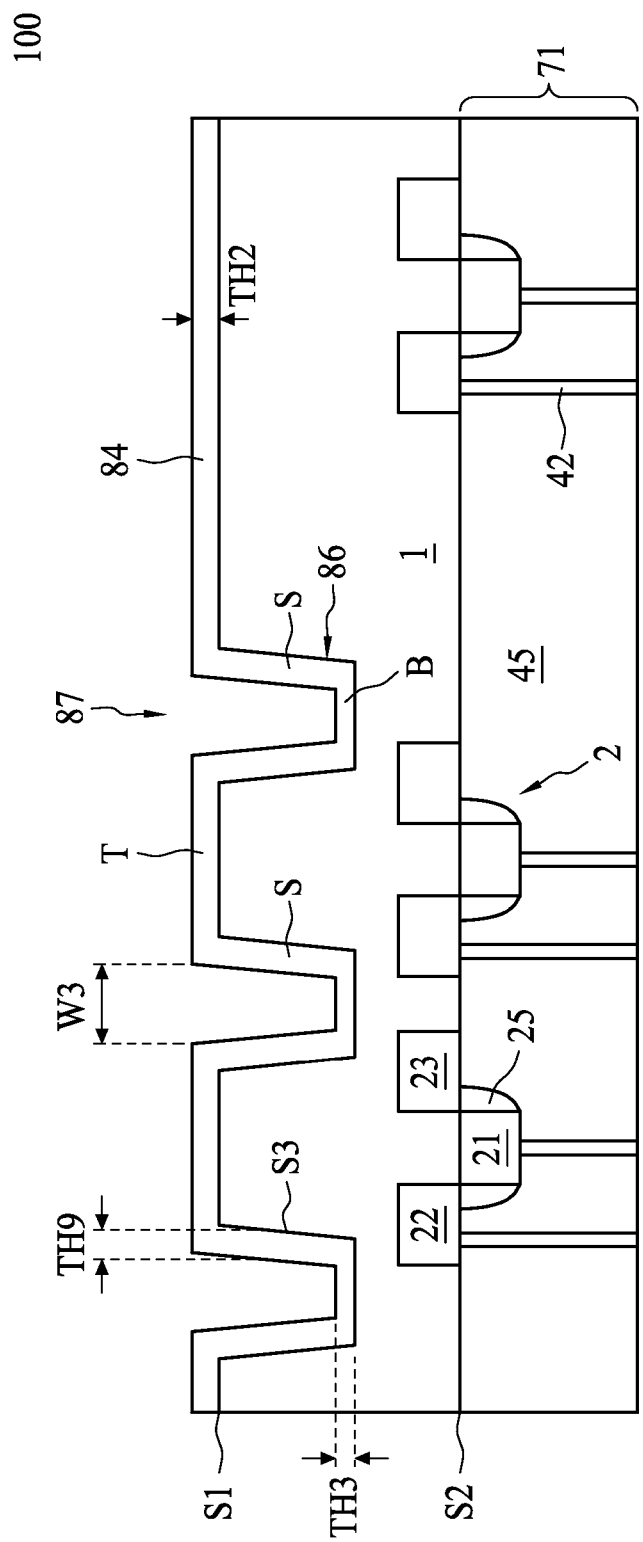
Figure 28:
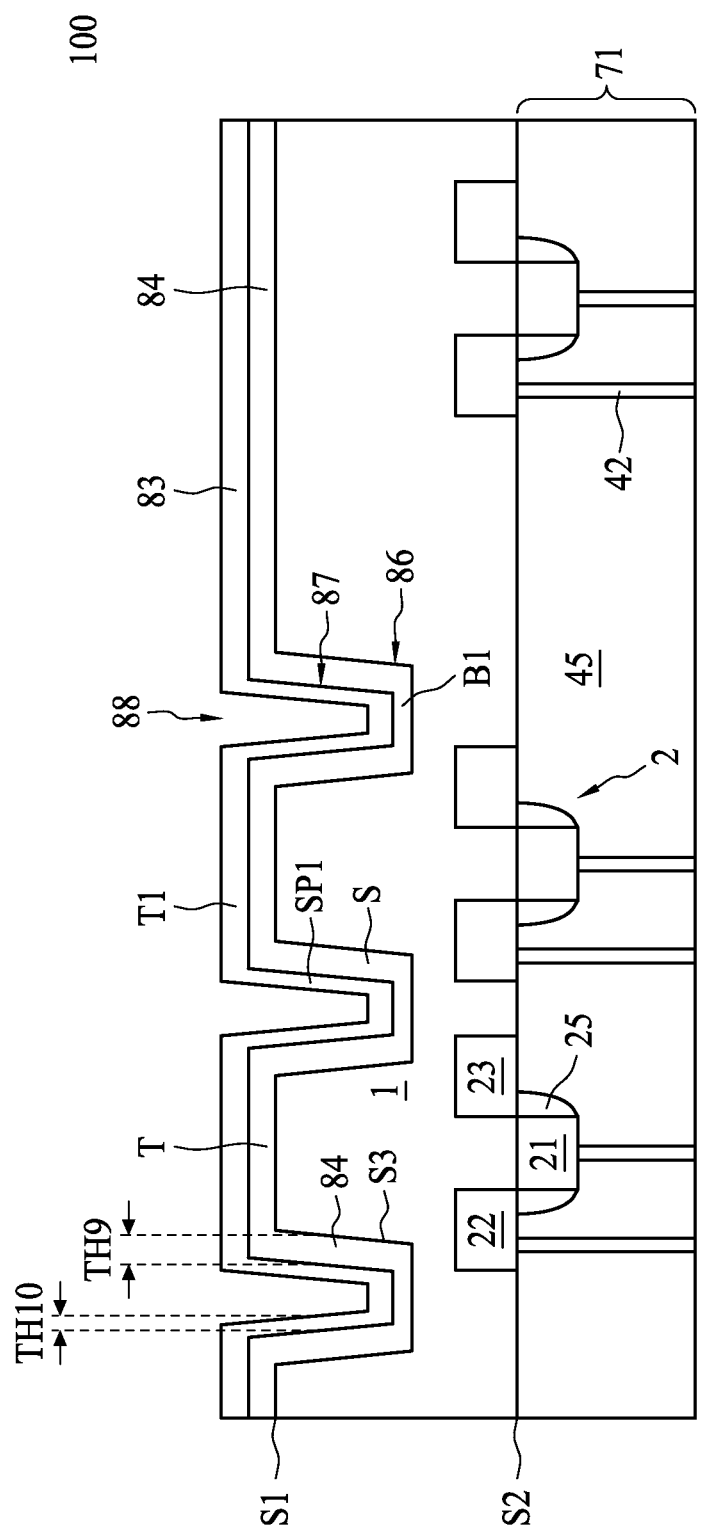
Figure 29:
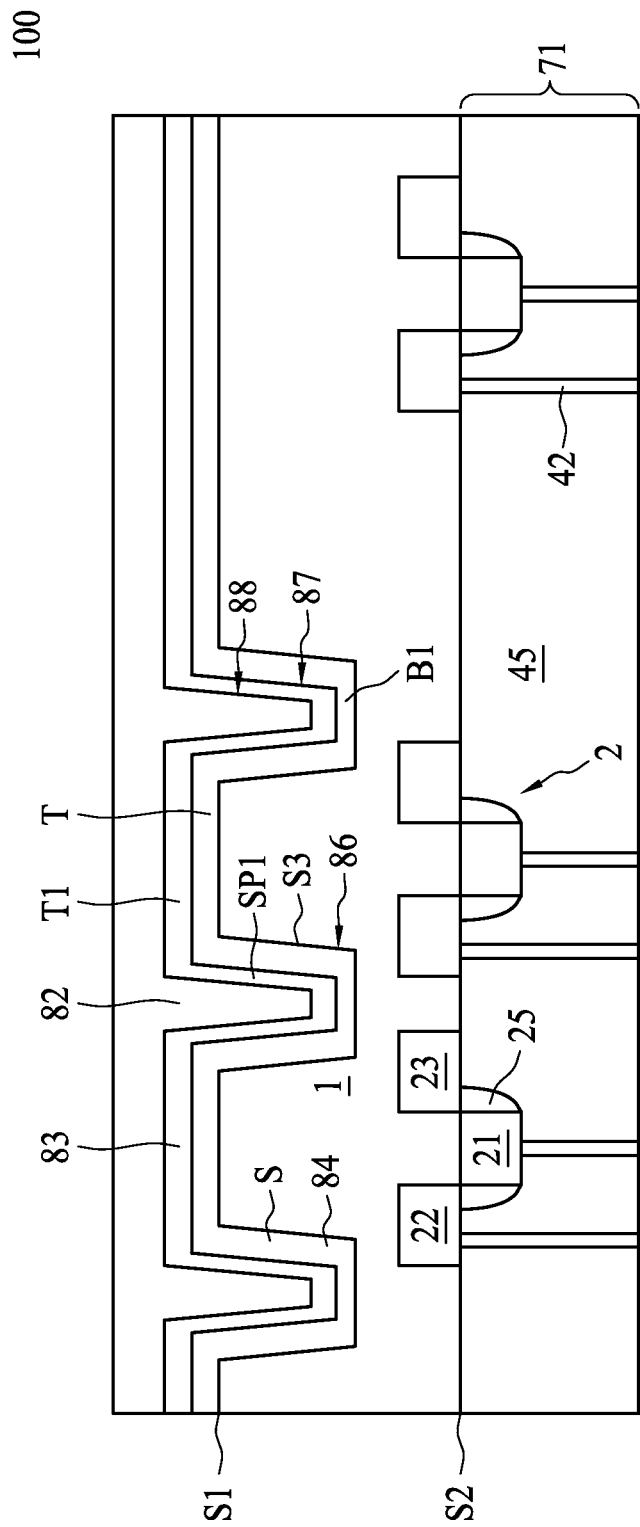
Figure 30:
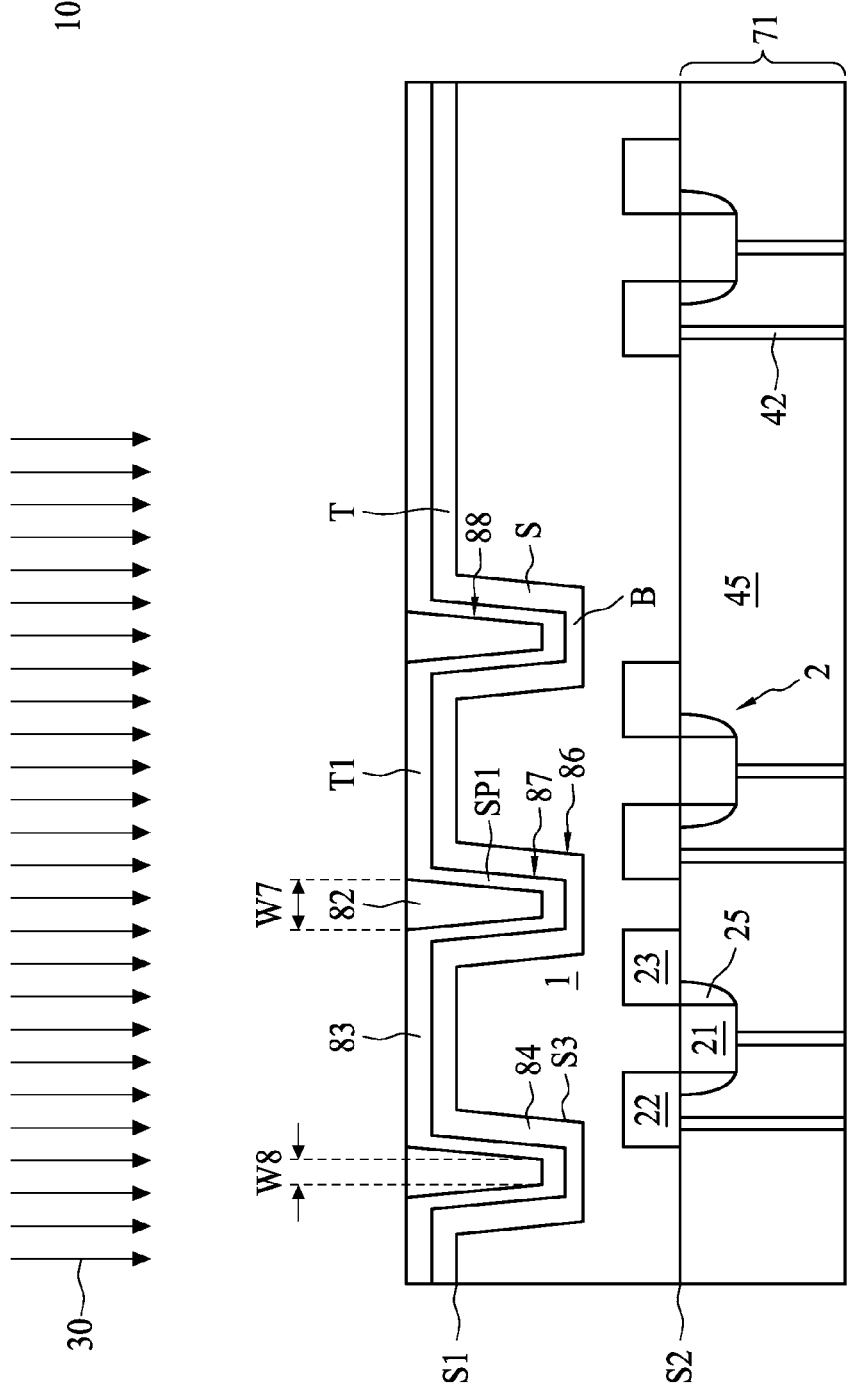
Figure 31:
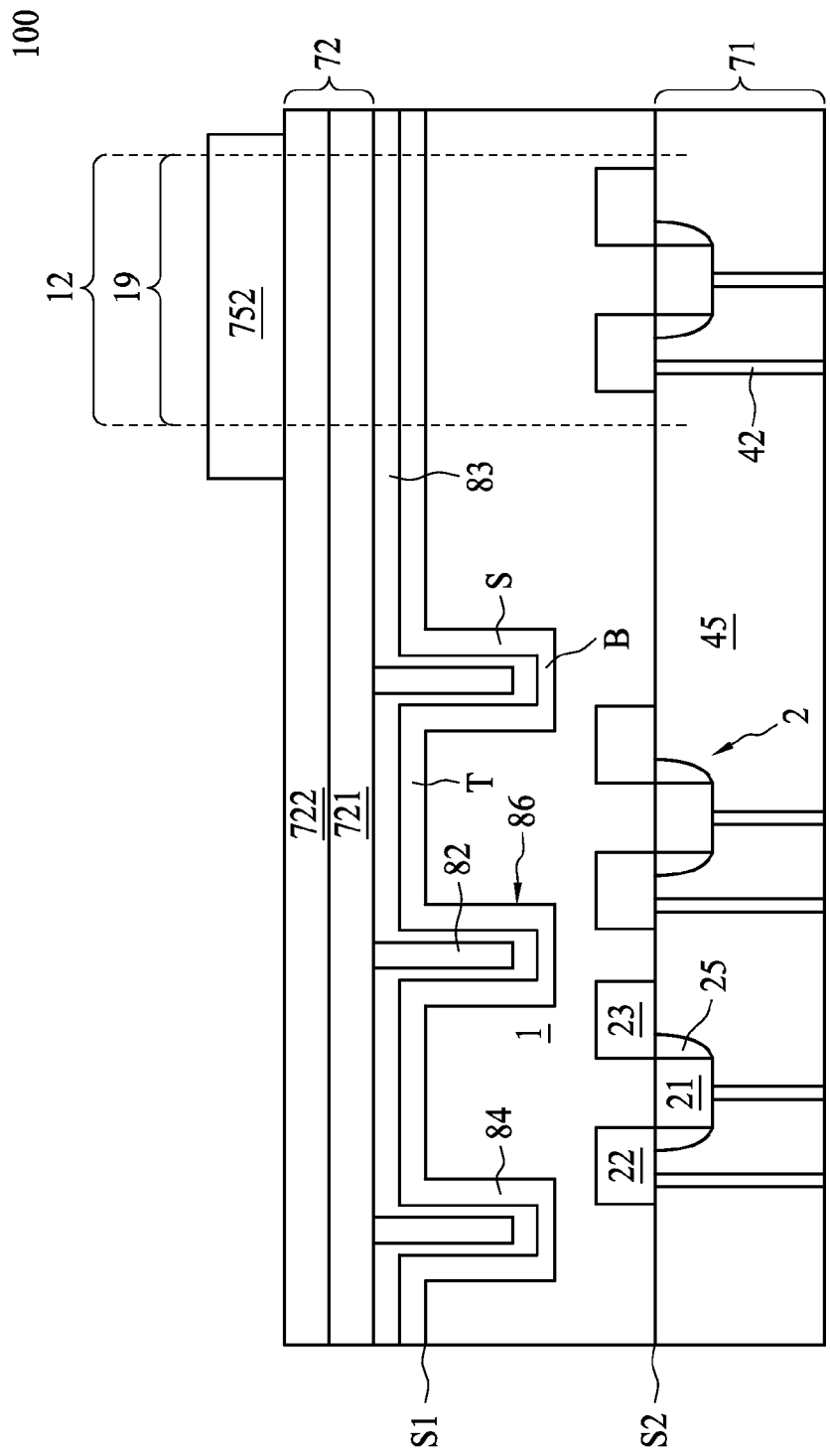

In FIG. 4, a method of manufacturing 400 is illustrated. FIG. 4 illustrates a process flow for forming the image sensor 100 in FIG. 2. Operation 410 receives a semiconductive substrate 1. Some exemplary embodiments for operation 410 are illustrated in FIG. 5. Operation 420 forms a transistor 2 coupled to a photosensitive element 22 or 23 at a front side S2 of the semiconductive substrate 1. Some exemplary embodiments for operation 420 are illustrated in FIGS. 6 to 8. Operation 430 forms a deep trench isolation (DTI) 86 at a back side S1 of the semiconductive substrate 1. Some exemplary embodiments for operation 430 are illustrated in FIGS. 15 to 17 and FIGS. 26 to 27. Operation 440 forms a dielectric layer 84 conformally over the DTI 86. Some exemplary embodiments for operation 440 are illustrated in FIGS. 18 and 28. Operation 450 forms a planarization stop layer 83 conformally over the dielectric layer 84. Some exemplary embodiments for operation 450 are illustrated in FIGS. 19 and 29. Operation 460 forms a low-transparent material 82 inside the DTI 86 and over the planarization stop layer 83. Some exemplary embodiments for operation 460 are illustrated in FIGS. 20 and 30. Operation 470 planarizes the low-transparent material 82. Some exemplary embodiments for operation 470 are illustrated in FIGS. 21, 22 and 31. Operation 480 determines whether the planarization stop layer 83 is exposed based on difference between a first transmittance of the planarization stop layer 83 and a second transmittance of the low-transparent material 82. Some exemplary embodiments for operation 480 are illustrated in FIG. FIGS. 21, 22 and 23.

In FIG. 5, the semiconductive substrate 1 is received. In some embodiments, semiconductive substrate 1 includes an isolation region (not shown) formed by etching a trench in the semiconductive substrate 1 on the front side S2 and filling the trench with insulator materials such as silicon oxide, silicon nitride, or silicon oxynitride.

A gate dielectric layer 213 is covering over the semiconductive substrate 1. In an embodiment, gate dielectric layer 213 is a thin film formed by a suitable deposition process. A gate electrode layer 214 is covering on top of gate dielectric layer 213. In an embodiment, gate dielectric layer 213 and gate electrode layer 214 are sequentially deposited over semiconductive substrate 1 by some deposition processes. In some embodiments, gate electrode layer 214 is made of polysilicon.

The deposition processes include chemical vapor deposition (CVD), physical vapor deposition (PVD), atomic layer deposition (ALD), high density plasma CVD (HDPCVD), metal organic CVD (MOCVD), remote plasma CVD (RP-CVD), plasma enhanced CVD (PECVD), low-pressure chemical vapor deposition (LPCVD) process, thermal oxidation, UV-ozone oxidation, epitaxial growth methods (e.g., selective epitaxy growth), sputtering, plating, spin-on coating, other suitable methods, and/or combinations thereof. The gate electrode layer 214 is deposited above the front side S2 of the semiconductive substrate 1.

The gate dielectric layer 213 and the gate electrode layer 214 are patterned by a lithographic process. In some embodiments, the gate dielectric layer 213 is patterned after the gate electrode layer 214 is patterned. In some embodiments, the lithographic process is a photolithographic process.

In the photolithographic process, a layer of resist 35 is formed on top of gate electrode layer 214 by a suitable process, such as spin-on coating, and patterned to form a resist feature by a photolithography patterning method. In some embodiments, the resist 35 is a photoresist. The resist feature can then be transferred by an etching process 32 to some underlying layers (i.e., gate electrode layer 214 or gate dielectric layer 213).

As an alternative to the photolithography, in some embodiments, a double-patterning lithography (DPL) process is used. The DPL process is a method of constructing a pattern on the gate electrode layer 214 by dividing the pattern into two interleaved patterns. Various DPL methodologies include double exposure (e.g., using two mask sets), forming some spacer features and removing the spacer features to provide a pattern, photoresist freezing, and/or other suitable processes. In some other embodiments, the photolithography process is implemented or replaced by other methods such as maskless photolithography, electron-beam writing, ion-beam writing, and/or molecular imprint. In another alternative, the lithography process could implement nanoimprint technology.

The etching process 32 is any suitable etching process such as dry etching, wet etching, reactive ion etching (RIE), and/or other etching methods. The etching process 32 is either purely chemical (plasma etching), purely physical (ion milling), and/or combinations thereof.

In FIG. 6, the resist feature is transferred to gate dielectric layer 213 and gate electrode layer 214 to form gate structure 21 on a front side S2 of the semiconductive substrate 1. The resist 35 is stripped thereafter. Gate structure 21 includes gate dielectric layer 213 and gate electrode layer 214.

In FIG. 7, an operation of forming a gate spacer 25 is illustrated. Gate spacer 25 is formed using any suitable process, including some processes described herein. A layer (not shown) is covering conformally over gate structure 21 and semiconductive substrate 1 by a deposition process. In some embodiments, the layer is made of dielectric materials such as silicon nitride, silicon nitride doped with carbon, silicon carbide, silicon oxide, silicon oxynitride, nitride with lower K, silicon oxynitride doped with carbon, other suitable materials, and/or combinations thereof. The layer is etched by any suitable etching process to form gate spacers 25 on either side of gate structure 21. In some embodiments, an anisotropic etching process by a dry etching process is used without photolithography. Some portions of the layer deposited on top of gate structure 21 and on front side S2 of semiconductive substrate 1 are etched faster than some vertical portions of the layer proximate to either side of gate structure 21. A thickness of gate spacer 25 is controlled by adjusting some process parameters in the deposition process. The process parameters in CVD includes a radio frequency (RF) source power, a bias power, a pressure, a flow rate, a wafer temperature, other suitable process parameters, and/or combinations thereof.

In FIG. 8, transistor 2 is formed coupling to photosensitive element 22 or 23 at front side S2 of the semiconductive substrate 1. In some embodiments, photosensitive element 22 or 23 is a source or a drain region formed by ion implantation or epitaxially growth. Ion implantation or epitaxial growth forms ion dopant in the source or the drain region. In various embodiments, the photosensitive element 23 or the photosensitive element 22 has different doping profiles formed by a multi-process implantation.

In some embodiments, a mask (not shown) is covered over gate structure 21 and over some portions of front side S2 of semiconductive substrate 1. A region uncovered by the mask is under ion implantation to form a first type of dopant. In some embodiments, the region uncovered by the mask is the source region containing p-type dopant as the first type of dopant. The mask is removed and a second mask is covered over gate structure 21 and over some other portions of front side S2 of semiconductive substrate 1. Subsequently, a second ion implantation is performed over front side S2. The second type of dopant is opposite to the first type of dopant. A region uncovered by the second mask is under the second ion implantation. In some embodiments, the region uncovered by the second mask is the drain region containing n-type dopant as the second type of dopant. The second mask is stripped thereafter.

Figure 9:
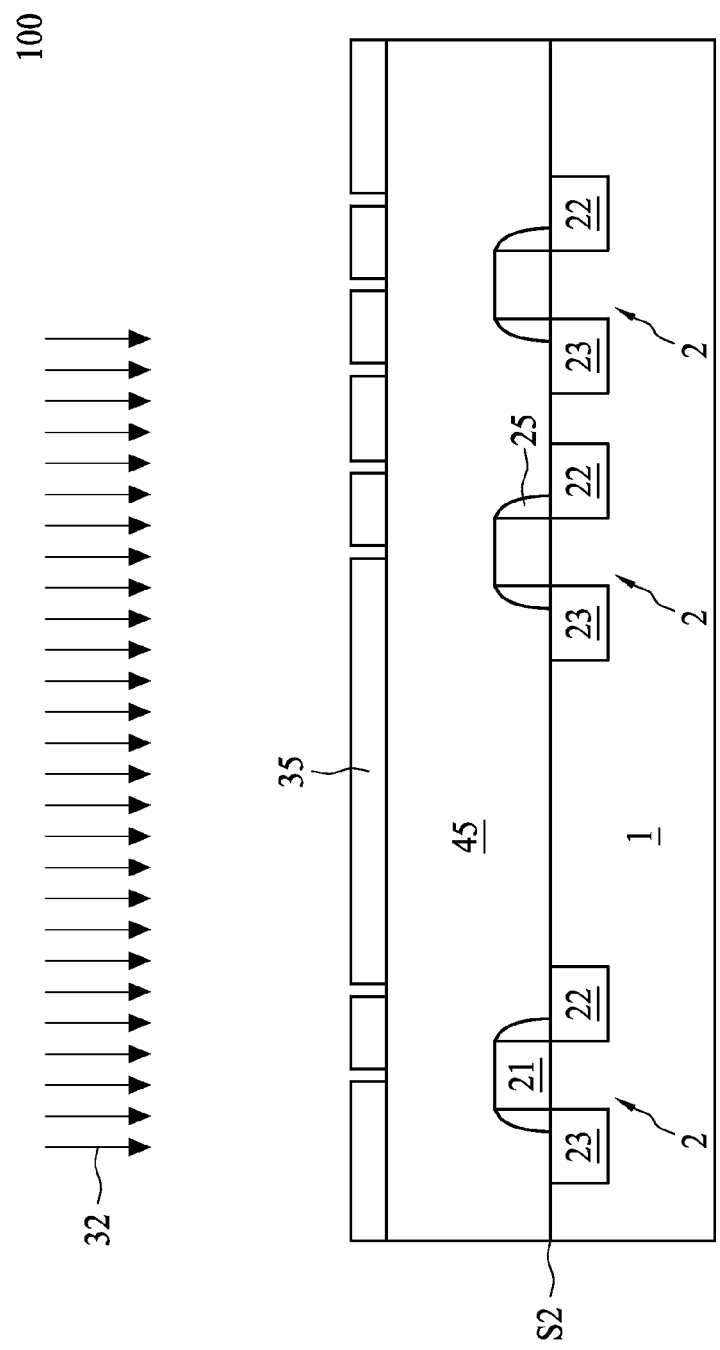

In FIG. 9, the dielectric layer 45 is covering over the semiconductive substrate 1 by any suitable process such as the deposition process. The dielectric layer 45 is in contact with front side S2 and gate structure 21. A resist 35 is formed on top of the dielectric layer 45. Some etching process 32 is performed to transfer a patterned resist feature to the dielectric layer 45.

Figure 10:
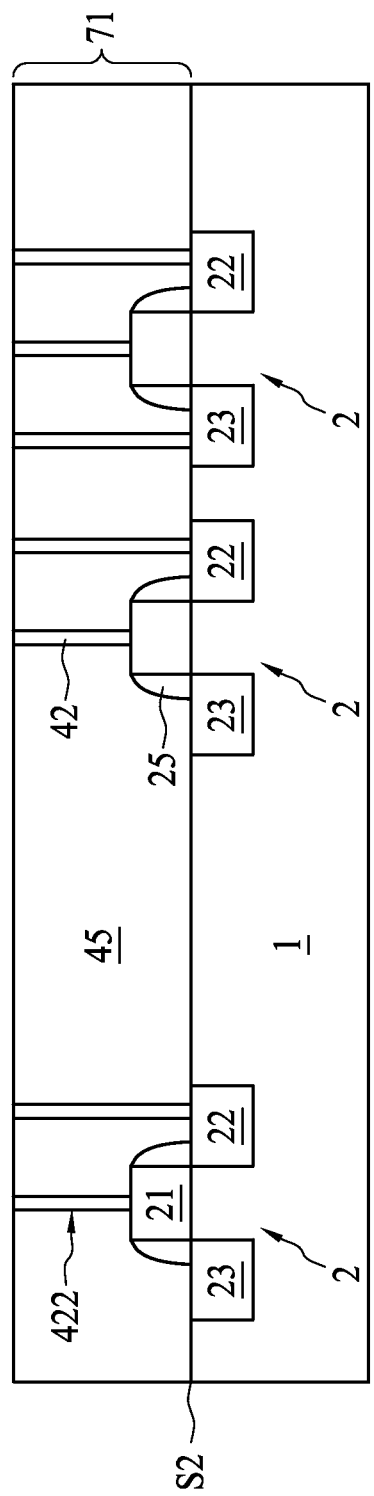

In FIG. 10, the patterned resist feature is transferred to dielectric layer 45 to form some trenches 422. In some embodiments, the trenches 422 are formed by any suitable etching process such as the selective etching, the dry etching, and/or combination thereof. The trenches 422 are filled by some conductive materials to form contacts 42. Contacts 42 are formed by filling the trenches 422 by some suitable processes such as the deposition process. A filling is up to a top of ILD layer 71. Contacts 42 are electrically couple with gate structure 21, photosensitive element 22, or photosensitive element 23 of transistor 2. A depth of the contacts 42 is controlled by adjusting some process parameters in a CVD process. The process parameters include a total pressure, some reactant concentrations, a deposition temperature, or a deposition rate.

Figure 11:
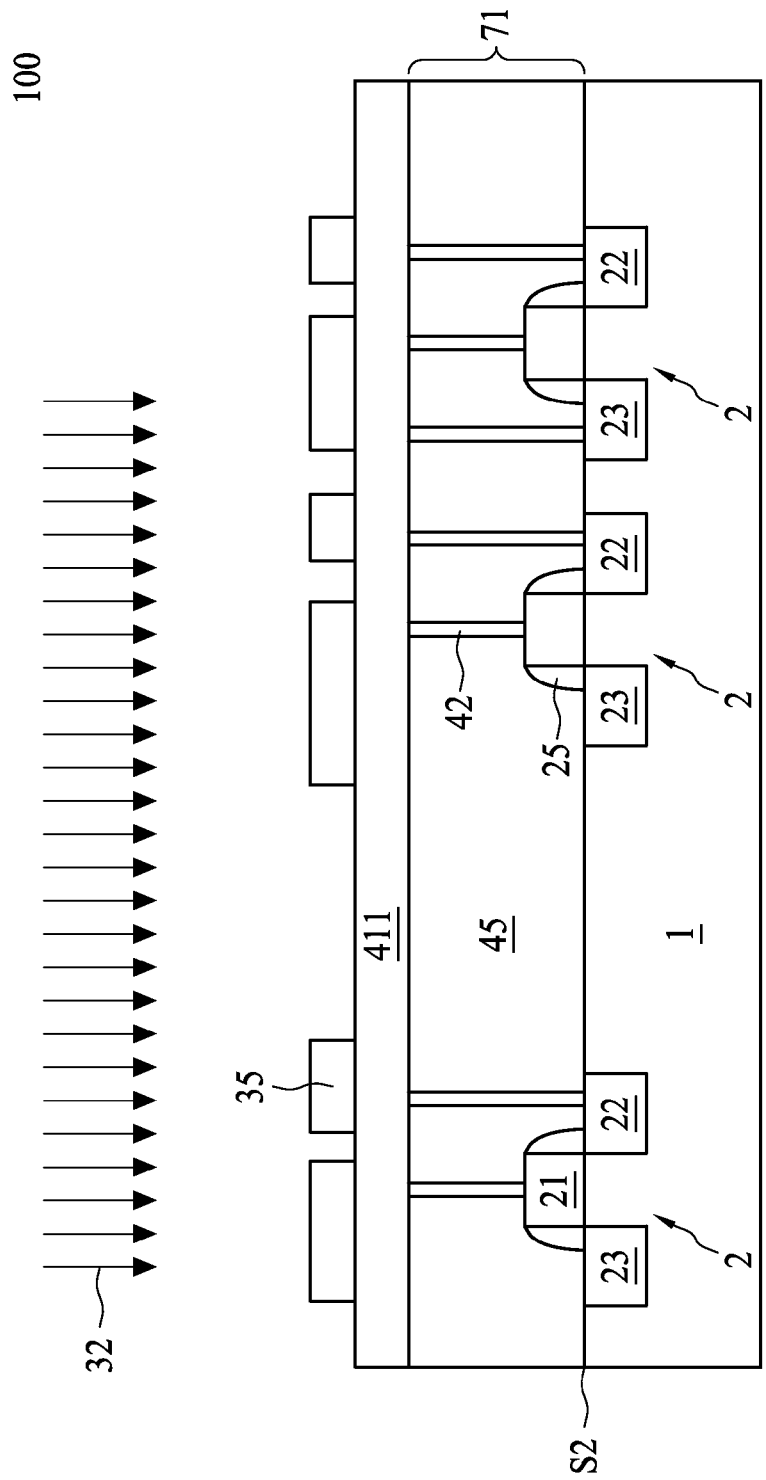
Figure 12:
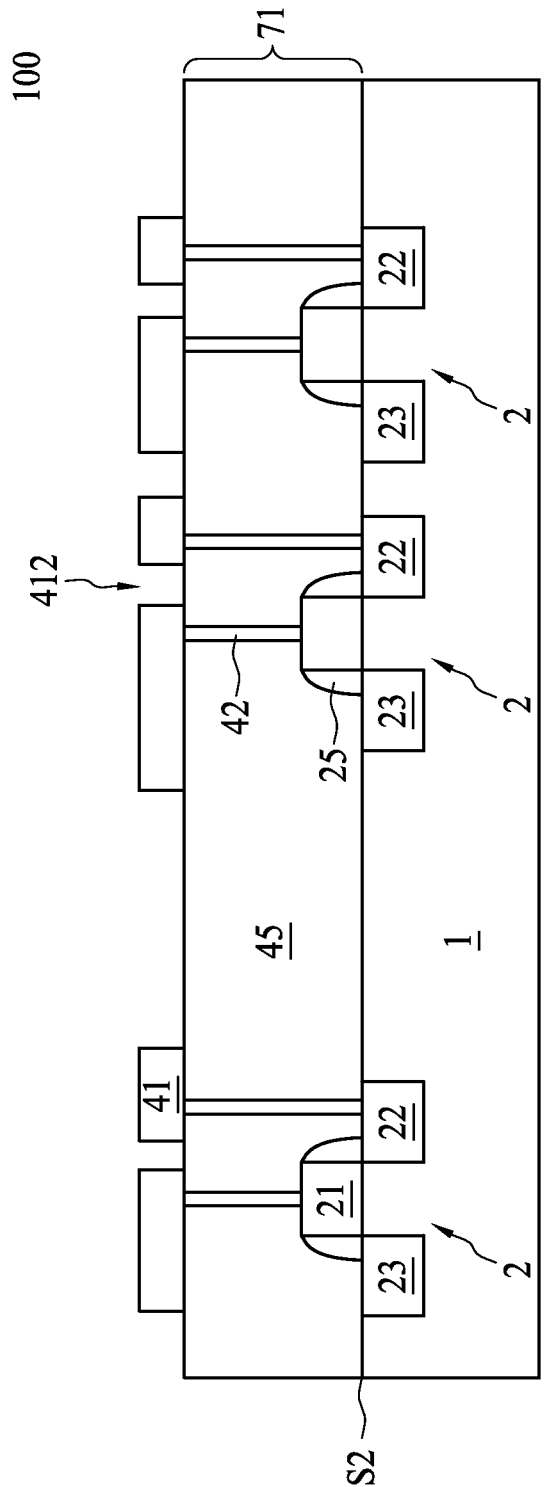

In FIG. 11, a conductive layer 411 are deposited and patterned by transferring a resist feature of resist 35 to conductive layer 411. The resist feature is transferred to conductive layer 411 to form recesses 412 and interconnections 41 in FIG. 12. The recesses 412 are to be filled by some dielectric materials to form the dielectric layer 46 over the ILD layer 71 in FIG. 14. The dielectric materials are covering over the interconnections 41.

Figure 13:
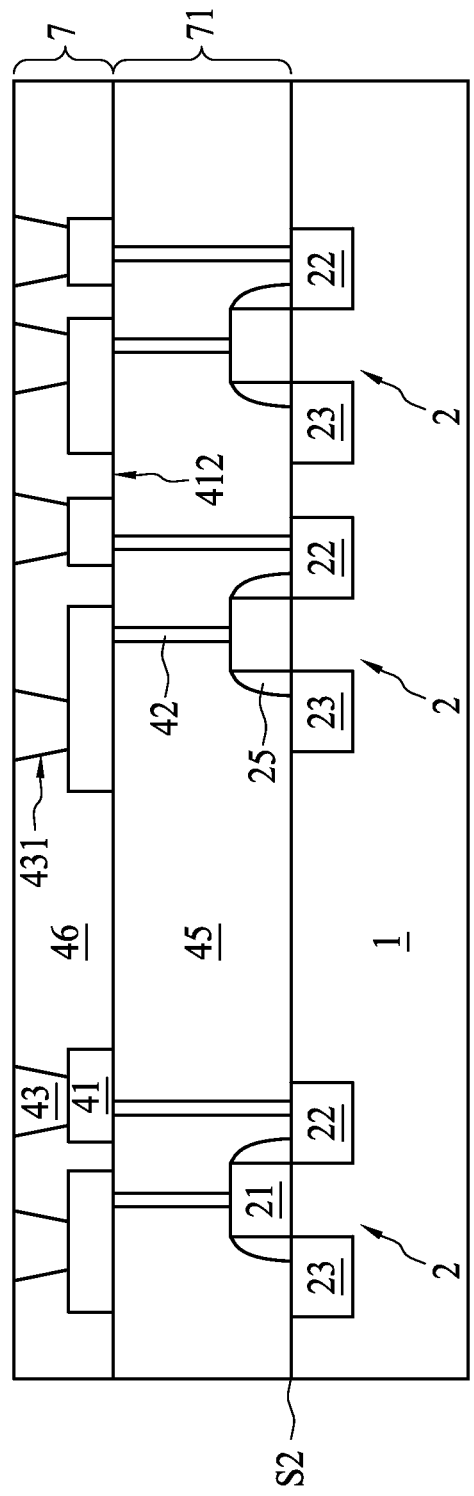

In FIG. 13, recess 431 is formed on dielectric layer 46 by some suitable etching processes. The suitable etching process exposes some portions of the interconnection 41. A conductive material is filled inside the recess 431 to form via 43. In some embodiments, a planarization, such as chemical mechanical planarizing CMP, is used to remove some excess blanket layers of the conductive materials such that the vias 43 are coplanar with a top of the dielectric layer 46.

Figure 14:
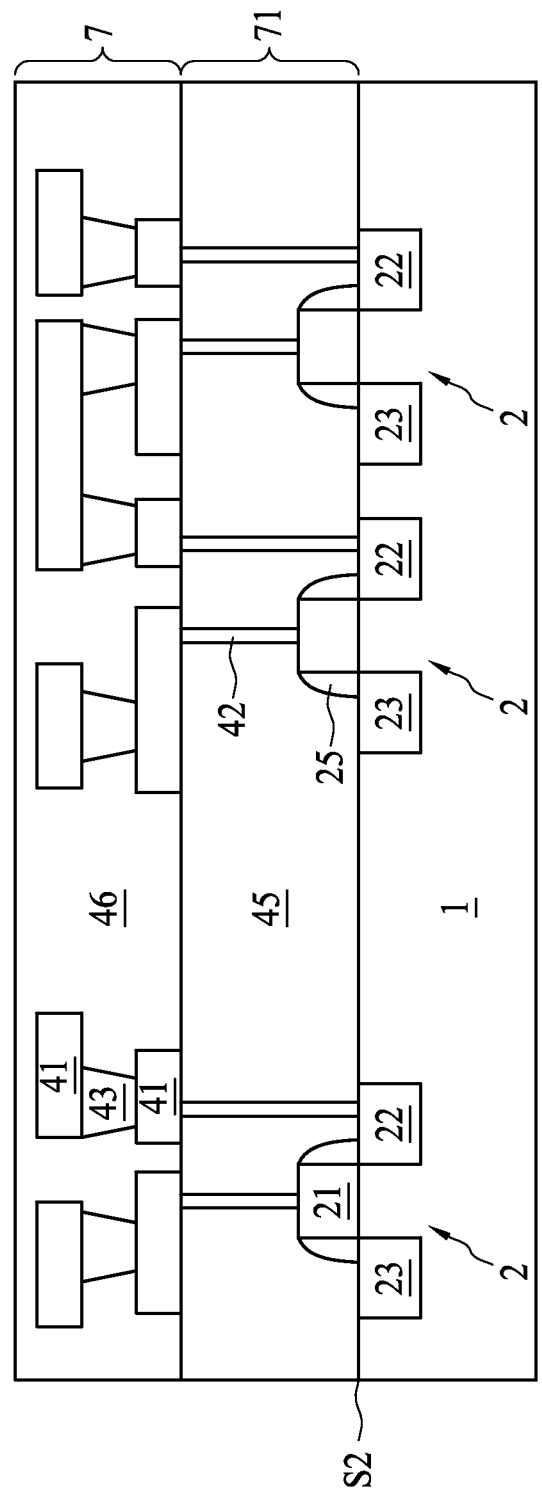

In FIG. 14, additional layer of interconnection 41 is formed in a similar fashion as a first layer of interconnection 41. In some embodiments, dielectric layer 46 is covering over the vias 43 and patterned to form some recesses to be filled by a conductive material to form interconnection 41. A dielectric material is deposited over interconnection 41.

Figure 15:
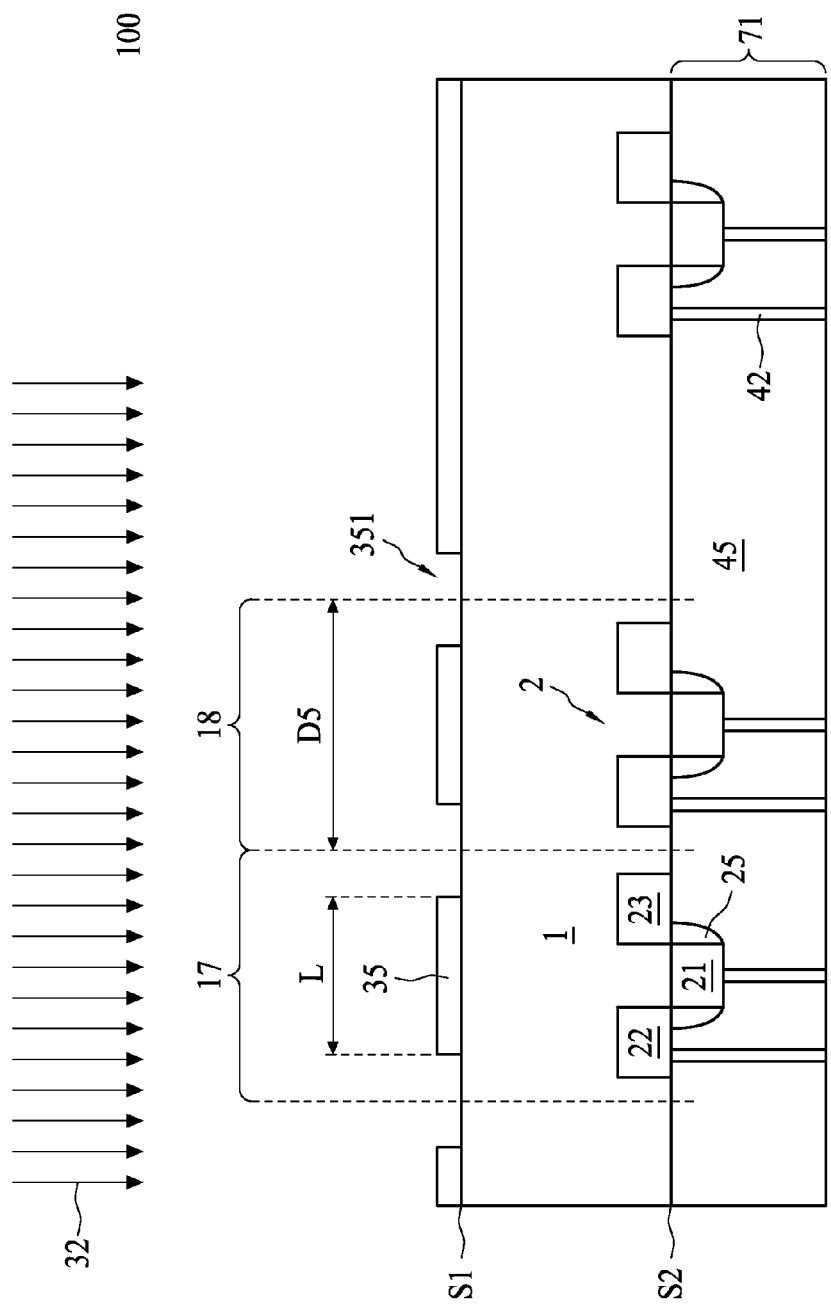

In FIG. 15, the image sensor 100 is flipped upside down such that the back side S1 of the semiconductive substrate 1 is above the front side S2. The back side S1 is partially covered by resists 35 with some openings 351. In some embodiments, resist 35 includes material such as oxide. Openings 351 expose some portions of back side S1 of semiconductive substrate 1 to etching process 32 in the photolithographic process. Openings 351 are spaced from each other by predetermined distance D5. Resist 35 includes a resist feature with length L inside each pixel region 17 or 18.

Figure 16:
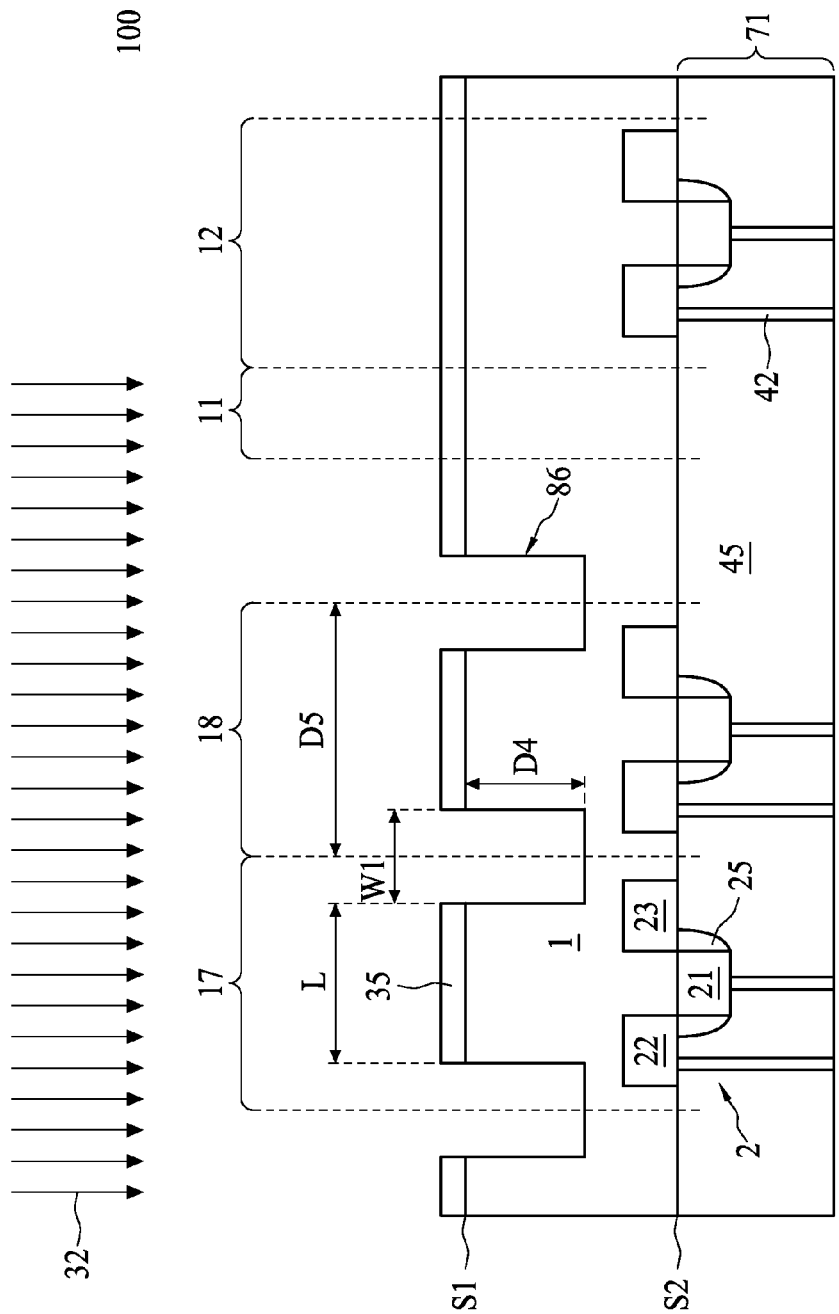

In FIG. 16, in some embodiments, the etching process 32 is a dry etching process over the back side S1 of the semiconductive substrate 1. The dry etching process is implemented in an etching chamber. Some process parameters in the dry etching process includes a radio frequency (RF) source power, a bias power, electrode size, a pressure, a flow rate, etching duration, a wafer temperature, other suitable process parameters, and/or combinations thereof. The dry etching process implements any suitable gas such as an oxygen-containing gas, fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr, He and/or CHBR3), iodine-containing gas, other suitable gases (Ar and/or CH4) and/or plasmas, and/or combinations thereof. In some embodiments, the dry etching process utilizes an O2 plasma treatment and/or an O2/N2 plasma treatment. Further, the dry etching process can be performed for a suitable duration under certain pressure range. Some process parameters such as etching durations and/or etch rate are adjustable to control depth D4 of DTI 86. DTI 86 is formed at a back side S1 of the semiconductive substrate 1.

Figure 17:
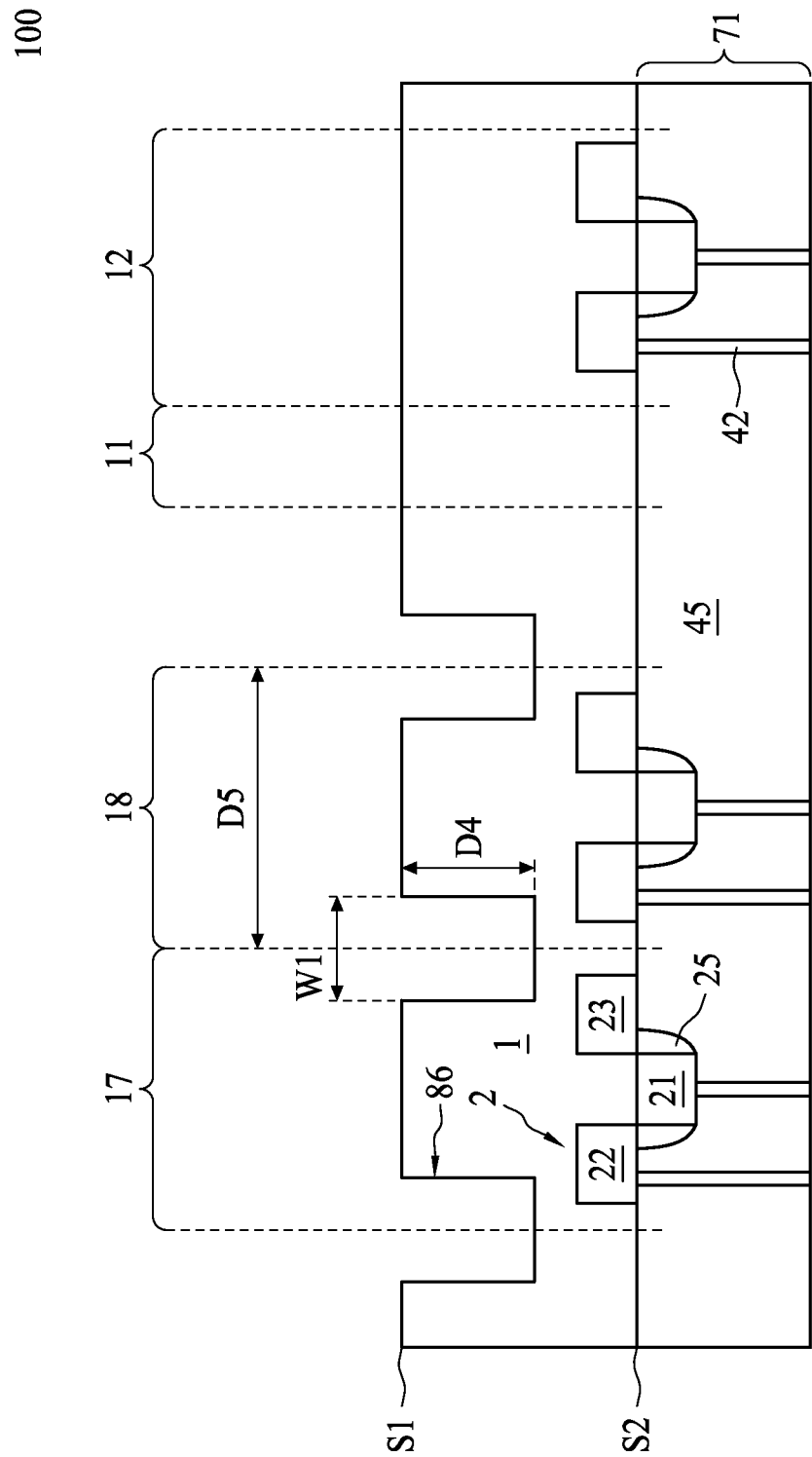

In FIG. 17, resist 35 is stripped after the dry etching process. After DTI 86 is formed, resist 35 is removed by using the wet etching process. The wet etching process is utilizing a hydrofluoric acid (HF) solution for a HF dipping process. Liquid chemical such as acids, bases, or solvents are used to chemically remove the resist 35. In some embodiments, the wet etching process is applying a diluted hydrofluoric acid to an intermediate structure such as resist 35. In some embodiments, the wet etching process includes exposing to a hydroxide solution containing ammonium hydroxide, diluted HF, deionized water, and/or other suitable etchant solutions. In some embodiments, resist 35 is an oxide resist layer over the semiconductive substrate 1. The oxide resist layer is removed by using a dilute hydrofluoric acid before the operation of forming the low-transparent material 82.

In FIG. 18, dielectric layer 84 is formed conformally over the DTI 86. Dielectric layer 84 is deposited inside the DTI 86 following a contour of DTI 86 and over the semiconductive substrate 1. Dielectric layer 84 is formed by using any suitable deposition process such as chemical vapor deposition (CVD), physical vapor deposition (PVD), atomic layer deposition (ALD), high density plasma CVD (HDP-CVD), metal organic CVD (MOCVD), remote plasma CVD (RPCVD), plasma enhanced CVD (PECVD), low-pressure chemical vapor deposition (LPCVD) process, thermal oxidation, UV-ozone oxidation, epitaxial growth methods (e.g., selective epitaxy growth), sputtering, plating, spin-on coating, other suitable methods, and/or combinations thereof. The deposition process forms dielectric layer 84 such that vertical thickness TH2 of top portion T, horizontal thickness TH1 of side portion S, or vertical thickness TH3 of bottom portion B is controlled by adjusting some process parameters in deposition process such as duration or deposition rate of the deposition process. For example, the process parameters in CVD includes a radio frequency (RF) source power, a bias power, a pressure, a flow rate, a wafer temperature, other suitable process parameters, and/or combinations thereof.

In FIG. 18, in some other embodiments, dielectric layer 84 is formed conformally over the DTI 86 by epitaxially growing the dielectric layer 84 in the DTI 86 and over the back side S1. Bottom portion B and side portion S forms a recess 87 over DTI 86. The dielectric layer 84 is formed in DTI 86 such that bottom portion B of dielectric layer 84 includes a vertical thickness TH3. A depth D8 of recess 87 is measured from bottom portion B to back side S1. In some embodiments, depth D8 is shorter than depth D4 of DTI 86 by vertical thickness TH3 of bottom portion B of dielectric layer 84. In some embodiments, horizontal thickness TH1 of side portion S is substantially constant from bottom portion B to top portion T of dielectric layer 84. In some embodiments, the side portion S is substantially vertical.

In FIG. 19, after the operation of forming dielectric layer 84 in FIG. 18, a planarization stop layer 83 is formed over dielectric layer 84 subsequently. Planarization stop layer 83 is formed on top of dielectric layer 84 following a contour of dielectric layer 84. Planarization stop layer 83 is partially filling the recess 87. Planarization stop layer 83 is lining against a side of recess 87 such that a recess 88 is formed over the recess 87.

Planarization stop layer 83 is formed by using any suitable deposition process such as chemical vapor deposition (CVD), physical vapor deposition (PVD), atomic layer deposition (ALD), high density plasma CVD (HDPCVD), metal organic CVD (MOCVD), remote plasma CVD (RP-CVD), plasma enhanced CVD (PECVD), low-pressure chemical vapor deposition (LPCVD) process, thermal oxidation, UV-ozone oxidation, epitaxial growth methods (e.g., selective epitaxy growth), sputtering, plating, spin-on coating, other suitable methods, and/or combinations thereof. The deposition process forms planarization stop layer 83 such that thickness TH5 of top section T1, thickness TH4 of side section SP1, or thickness TH8 of bottom section B1 is controlled by adjusting some process parameters in deposition process such as duration or deposition rate of the deposition process. For example, the process parameters in CVD includes a radio frequency (RF) source power, a bias power, a pressure, a flow rate, a wafer temperature, other suitable process parameters, and/or combinations thereof.

Bottom section B1 and side section SP1 forms a recess 88 over recess 87 and over DTI 86. The planarization stop layer 83 is formed in DTI 86 such that bottom section B1 of planarization stop layer 83 includes a thickness TH8. A depth D9 of recess 88 is measured from bottom section B1 to back side S1. In some embodiments, depth D9 is shorter than depth D8 of recess 87 by thickness TH8 of bottom section B1 of planarization stop layer 83. In some embodiments, planarization stop layer 83 is formed as a thin film such that thickness TH8 of bottom section B1 is substantially smaller than vertical thickness TH3 of bottom portion B, and depth D9 is substantially equal to depth D8. In some embodiments, thickness TH4 of side section SP1 is substantially smaller than horizontal thickness TH1 of side portion S such that a ratio between horizontal thickness TH1 to thickness TH4 is substantially larger than 1. Thickness TH5 of top section T1 of planarization stop layer 83 is predetermined for protecting an underlying dielectric layer 84 from damage by some other manufacturing process such as a planarization process. In some embodiments, planarization stop layer 83 is configured to protect an underlying layer such as semiconductive substrate 1 from contamination by low-transparent material 82 during other manufacturing process such as a planarization process.

In FIG. 20, in some embodiments, low-transparent material 82 is filled in DTI 86. Low-transparent material 82 is border with side section SP1 and bottom section B1 of planarization stop layer 83 inside DTI 86. Low-transparent material 82 is filling inside recess 88. Low-transparent material 82 is covering over back side S1. Low-transparent material 82 is deposited on top of top section T1 of planarization stop layer 83 by any suitable deposition process such as chemical vapor deposition (CVD), physical vapor deposition (PVD), atomic layer deposition (ALD), high density plasma CVD (HDPCVD), metal organic CVD (MOCVD), plasma enhanced CVD (PECVD), low-pressure chemical vapor deposition (LPCVD) process, sputtering, plating, other suitable methods, and/or combinations thereof. In some embodiments, a conductive material such as tungsten is filled inside DTI 86 by any suitable deposition process.

In FIG. 21, a planarization is performed to remove excess low-transparent material 82 such that a top surface of low-transparent material 82 is substantially coplanar with a surface 831 of top section T1. The planarization removes a top layer of low-transparent material 82 above top section T1 of planarization stop layer 83. The planarization is performed until an underlying top section T1 of planarization stop layer 83 is exposed.

In FIG. 22, in some other embodiments, the planarization is performed by any suitable method such as chemical mechanical planarizing CMP 31.

The planarization is performed by any suitable process such as etching back process 30 in FIG. 21 or CMP 31 in FIG. 22. In some embodiments, the planarization includes using a selective etching. The selective etching uses some fluorine-containing gas, HBr and/or Cl2 as etch gases. A bias voltage used in the etching back process 30 in FIG. 21 is adjusted. In some embodiments, the selective etching includes a faster etching rate for tungsten in the low-transparent material 82 than for aluminum oxide (Al2O3) in the planarization stop layer 83. Different etchant can be used for etching different compositions of materials.

In some embodiments, to determine whether to stop the planarization process is by using a form of endpoint detection to monitor the planarization process to minimize over etching of an underlying layer such as dielectric layer 84.

Different materials emit different wavelengths of light when brought into plasma during the planarization process. A light emitted by excited atoms and molecules in plasma is analyzed with optical emission spectroscopy to identify the materials. For example, some atoms from low-transparent material 82 enter into plasma are excited and emitting the light with a color including an optical spectrum. The light is passed through a filter to allow a certain wavelength of the light to pass through. The certain wavelength of the light is used for identifying the materials being etched from low-transparent material 82. When low-transparent material 82 is removed, the planarization process changes to planarizing planarization stop layer 83. A change in a material under the planarization process alters the optical spectrum of the light emitted. An altering of the optical spectrum is used to determine whether to stop the planarization process. The form of endpoint detection includes measuring different parameters such as a change in etching rate, or a change in types of byproduct from the planarization process.

In some other embodiments, an intensity of the light emitted is related to a relative concentration of the excited atom in plasma. The form of endpoint detection is to determine when a reaction process is complete by monitoring a level of a byproduct originates from low-transparent material 82 under the planarization process. A completion of the process is indicated by a sharp drop in the level of the byproduct emitted from a reaction during the planarization process.

In some embodiments, the form of endpoint detection is to determine whether planarization stop layer 83 is exposed based on difference between an optical property of planarization stop layer 83 and a layer being planarized above such as low-transparent material 82. The optical property includes a transmittance or a reflectance of the material under the planarization process. Optical property is measured by detecting a polarization, intensity or an interference of a reflected light 812 from a surface of the material under the planarization process. A variation in the reflected light 812 is used to recognize an altering of an optical property of the surface. For example, an incident light 81 includes a first intensity. Incident light 81 hits a surface 821 of the low-transparent material 82. In some embodiments, incident light 81 is a laser with the predetermined wavelength for detecting differences between optical properties of different materials such as planarization stop layer 83 and low-transparent material 82. A reflected light 812 includes a second intensity. Upon exposing planarization stop layer 83, a reflected light 815 replaces reflected light 812. Reflected light 815 includes a third intensity different from the second intensity. A variation in intensity from reflected light 812 to 815 indicates a completion of the planarization process.

In some embodiments, low-transparent material 82 includes a lower transmittance than a transmittance of planarization stop layer 83. For a same intensity of incident light 81, less fraction of incident light 81 is transmitting into low-transparent material 82 than is transmitting into planarization stop layer 83.

In some embodiments, low-transparent material 82 includes a higher reflectance than a reflectance of planarization stop layer 83. For a same intensity of incident light 81, more fraction of incident light 81 is reflected from low-transparent material 82 than is reflected from planarization stop layer 83.

Figure 23:
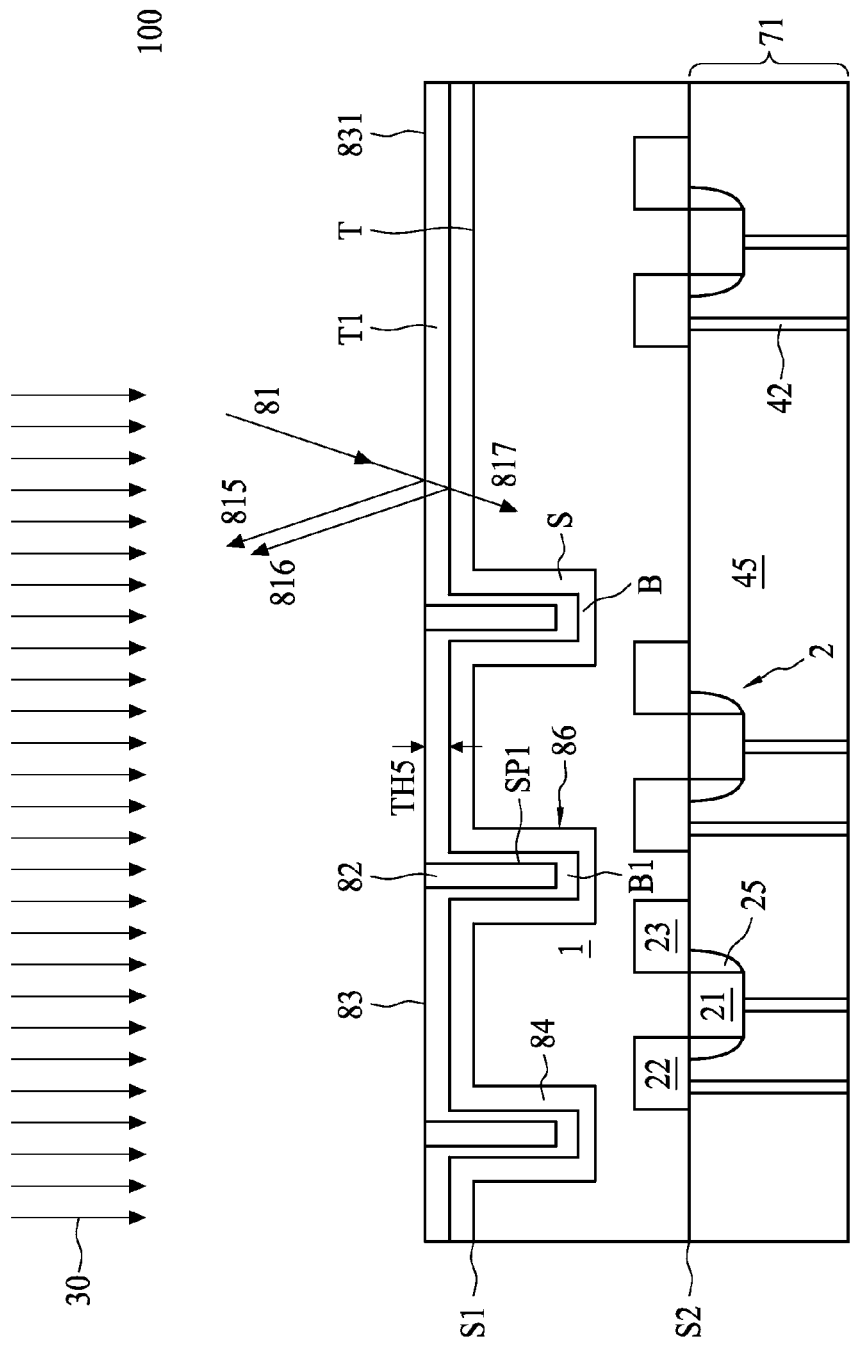
Figure 24:
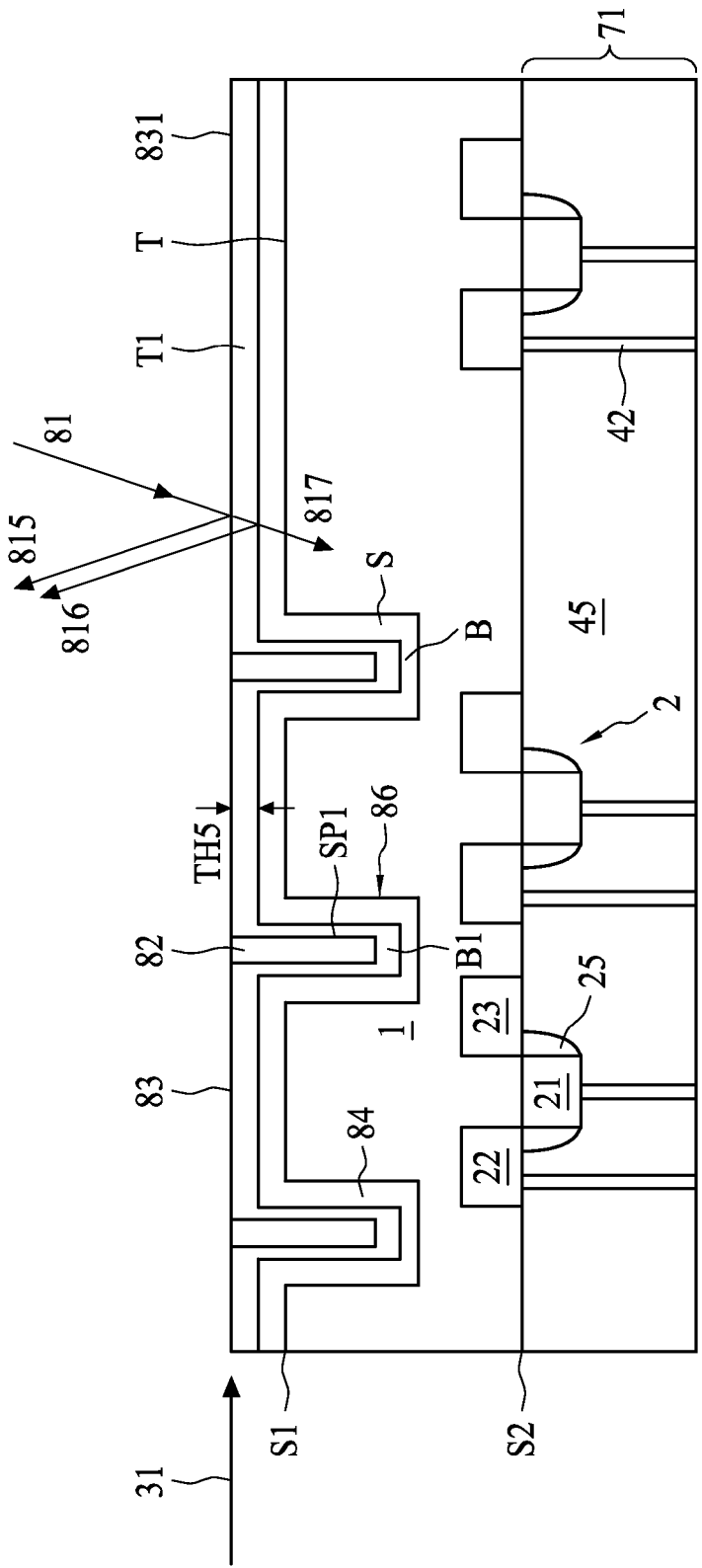

In FIGS. 23 and 24, when a top layer of low-transparent material 82 is removed, the reflected light 812 suddenly reflected from a different material surface 831 of planarization stop layer 83. A change in an intensity of reflected light 812 is detected as a completion of a removing of the top layer of low-transparent material 82.

FIG. 23 is following the embodiment from FIG. 21. In FIG. 23, top section T1 of planarization stop layer 83 is remained over dielectric layer 84. In FIG. 23, in some embodiments, planarization stop layer 83 is remained and covering conformally over top portion T of dielectric layer 84. Low-transparent material 82 is filling in DTI 86 such that low-transparent material 82 is lining against side section SP1 of planarization stop layer 83. In some embodiments, low-transparent material 82 is coplanar to a level of top section T1.

In some other embodiments, the form of endpoint detection is to determine a predetermined thickness of a material under etching back process 30 in FIG. 21. A thickness measurement system is used to monitor a change in a thickness of a layer under etching or planarization. In some embodiments, the measurement system for thickness measurement is an interferometry.

For example, in FIG. 23, after the top layer of low-transparent material 82 is removed, planarization stop layer 83 is exposed. At a completion of the etching back process 30 in FIG. 21, incident light 81 is a monochromatic light source used and reflected from surface 831 of planarization stop layer 83. Reflected light 815 reflects from surface 831, while reflected light 816 reflects from an interface between top section T1 and top portion T. A shift in phase between reflected light 815 and reflected light 816 generates interference fringes pattern. The interference fringes are measured to determine a thickness of different layers under the planarization process. A measuring point is at top section T1 of planarization stop layer 83. For end point detection the interference fringe pattern is simulated for planarization stop layer 83 at thickness TH5 and then compared during the planarization process with measured signals from reflected lights 815 and 816.

FIG. 24 is following the embodiment from FIG. 22. In FIG. 24, a top layer of low-transparent material 82 is removed by planarization. In FIG. 24, CMP 31 in FIG. 22 is performed such that a portion of low-transparent material 82 inside DTI 86 is exposed. A top section T1 of planarization stop layer 83 is remained on top of dielectric layer 84.

In some embodiments, the interference fringe pattern is simulated for various layers. For example, in FIG. 24, the thickness measurement system is used to monitor a thickness of planarization stop layer 83 at a completion of a removal of the top layer. In various embodiments, the planarization is performed with any suitable end point detection method.

Figure 25:
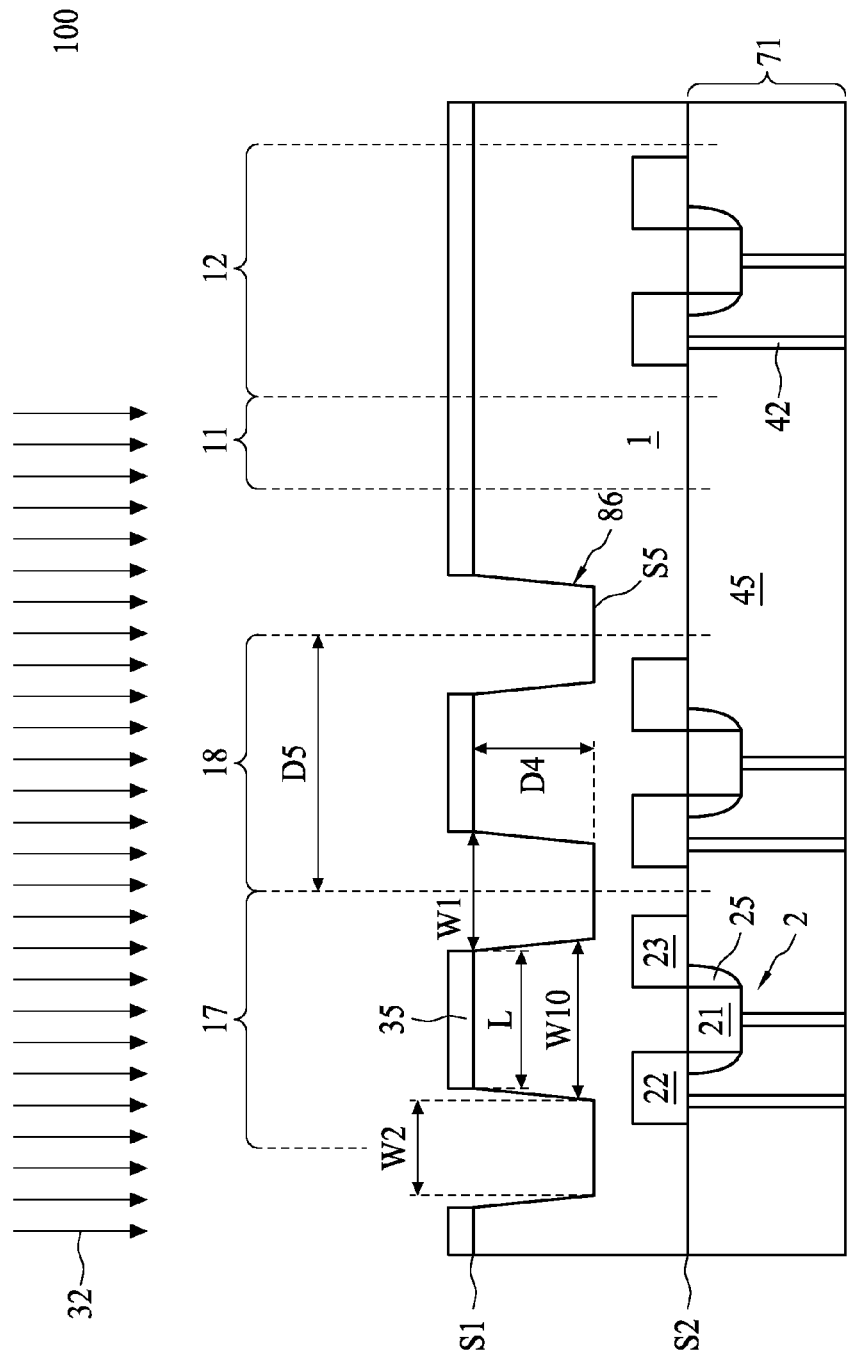

FIG. 25 illustrates another embodiment of the present disclosure. FIG. 25 is following the embodiment from FIG. 15. In FIG. 26, etching process 32 is forming DTI 86 in semiconductive substrate 1. FIG. 26 is different from FIG. 16 in that DTI 86 in FIG. 26 includes a tapered side wall S3 such that a bottom side S5 of DTI 86 includes a width W2 smaller than a width W1 at a top side of DTI 86 near back side S1. A section of resist 35 includes a length L in pixel 17. Width W10 is measured from one side S3 of a DTI 86 to another side S3 of a neighboring DTI 86. Side S3 is tapered such that length L is shorter than width W10.

In FIG. 26, resist 35 is removed by any suitable process such as wet etching or dry etching. In FIG. 27, dielectric layer 84 is deposited over semiconductive substrate 1. In some embodiments, thickness TH9 of side portion S of dielectric layer 84 is variable from bottom portion B to top portion T. in some other embodiments, thickness TH9 of side portion S of dielectric layer 84 is constant from bottom portion B to top portion T.

In FIG. 28, planarization stop layer 83 is formed over the dielectric layer 84. Planarization stop layer 83 is deposited conformally on top of the dielectric layer 84 in DTI 86 such that side section SP1 is lined to side portion S. In some embodiments, horizontal thickness TH10 of side section SP1 of tapered side S3 is substantially thinner than thickness TH9 of side portion S.

In FIG. 29, low-transparent material 82 is formed over planarization stop layer 83. Low-transparent material 82 also filled inside DTI 86. In FIG. 30, a top layer of low-transparent material 82 is removed by any suitable method of planarization such that a top surface of low-transparent material 82 is exposed. The top surface of low-transparent material 82 includes a width W7. In some embodiments, width W7 is larger than width W8 of a bottom surface of recess 88.

FIG. 31 is an exemplary embodiment for FIG. 2. In some embodiments, FIG. 31 is following the embodiment from FIG. 23. In FIG. 31, the multilayer structure 72 is formed on top of the back side S1. Transmitting layer 721 and second transmitting layer 722 are formed sequentially by the deposition processes such as CVD, PECVD, or other suitable methods. Light shielding layer 752 is formed on top of multilayer structure 72 by depositing and patterning light shielding layer 752. The light shielding layer 752 is formed by the deposition process including depositing a metal layer (or a layer of another opaque material) over the second transmitting layer 722. The deposited layer is etched to leave the light shielding layer 752 in a region corresponding to the black level reference pixels 19.

In FIG. 31, black level reference pixels 19 is formed by forming the light shielding layer 752 on the second transmitting layer 722. The capping layer 723 is blanket formed over the light shielding layer 752 and the second transmitting layer 722. In some embodiments, capping layer 723 is a passivation layer.

Figure 32:
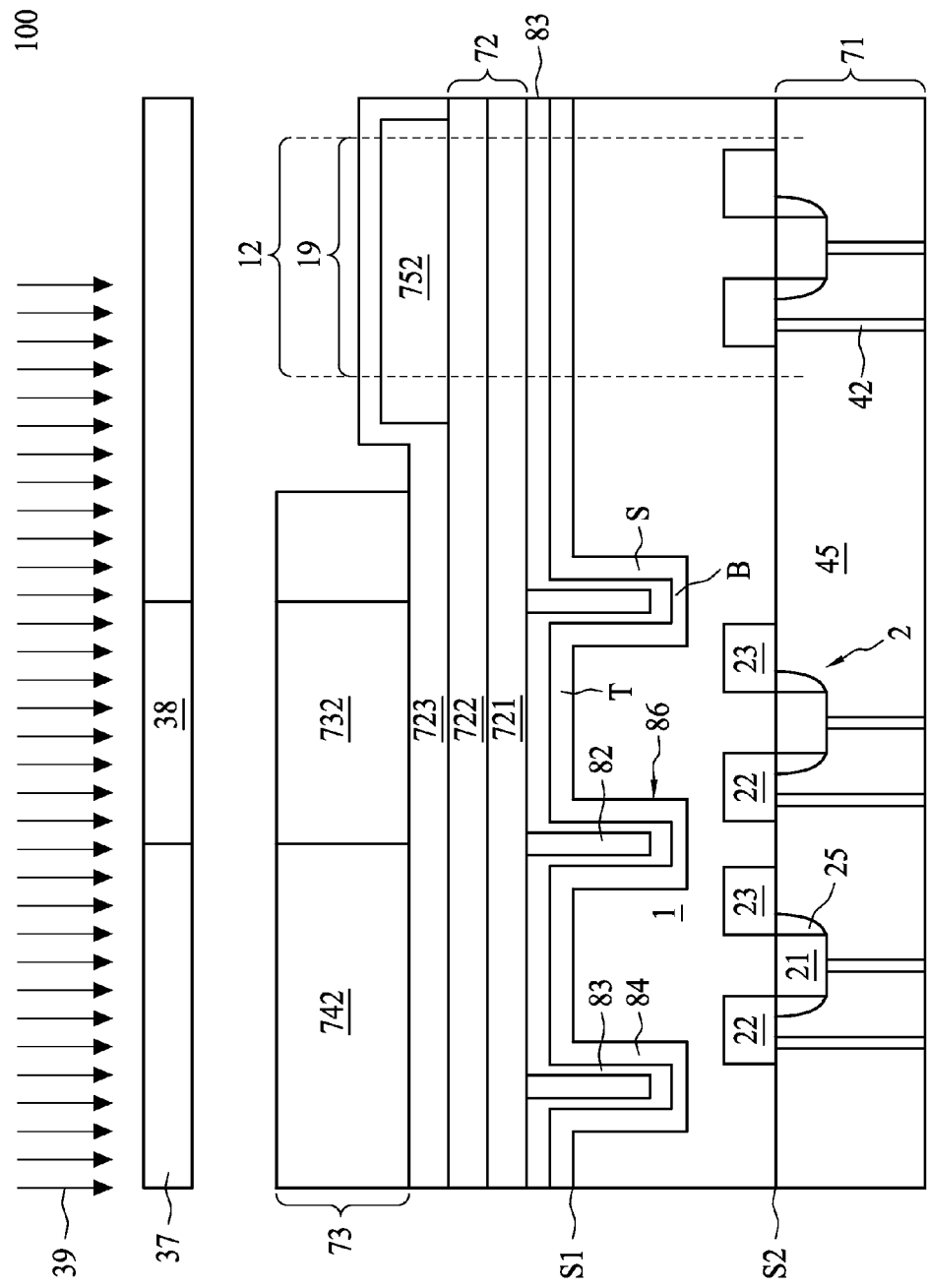

In FIG. 32, a color resist 742 is formed over the multilayer structure 72. The color resist 742 is for allowing a light with a color red, green, or blue to pass through. The color resist 742 is formed by any suitable process such as a deposition process. The deposition process may be spin-on coating, chemical vapor deposition (CVD), physical vapor deposition (PVD), atomic layer deposition (ALD), or combination thereof.

A suitable process such as photolithography is performed on the color resist 742. In photolithography the color resist 742 is exposed through a photomask 37. A photomask 37 is patterned to include a region 38. The region 38 forms a pattern over a portion 732 of color resist 742 in pixel region 18. The DTI 86 serves to define the boundary for each pixel region 17 or 18 of different color. The photomask 37 is placed over the color resist 742 to allow ultraviolet (UV) light 39 reaching to portion 732 of the color resist 742 under the region 38. The color resist 742 is photosensitive. To make the pattern insoluble, the portion 732 is UV cured by exposure through region 38 of photomask 37. Other soluble portions of the color resist 742 are removed by a developing solution. The pattern is cured through baking. The portion 732 is hardened, insoluble and remained on top of the multilayer structure 72 after baking.

Figure 33:
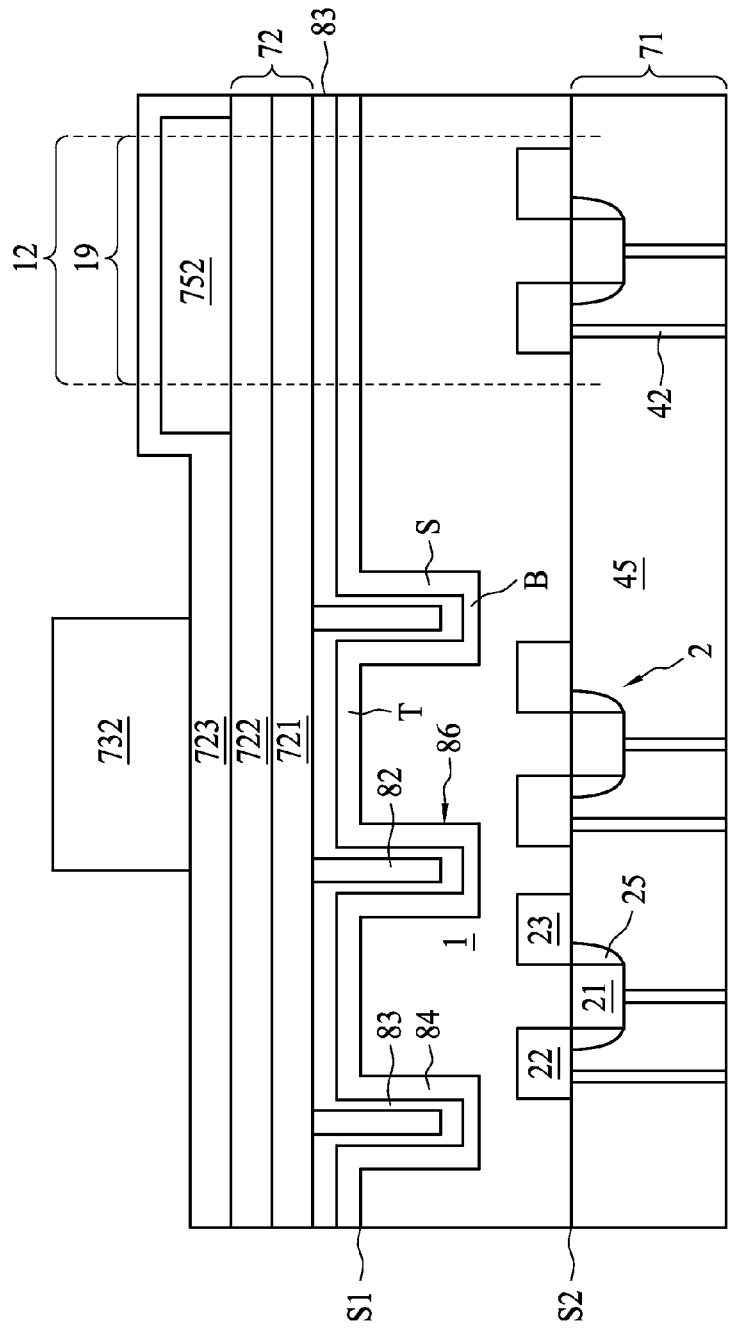

In FIG. 33, the portion 732 remained is a color filter 732. The color filter 732 is aligned within the pixel region 18. Capping layer 723 at other region such as pixel region 17 is exposed.

Figure 34:
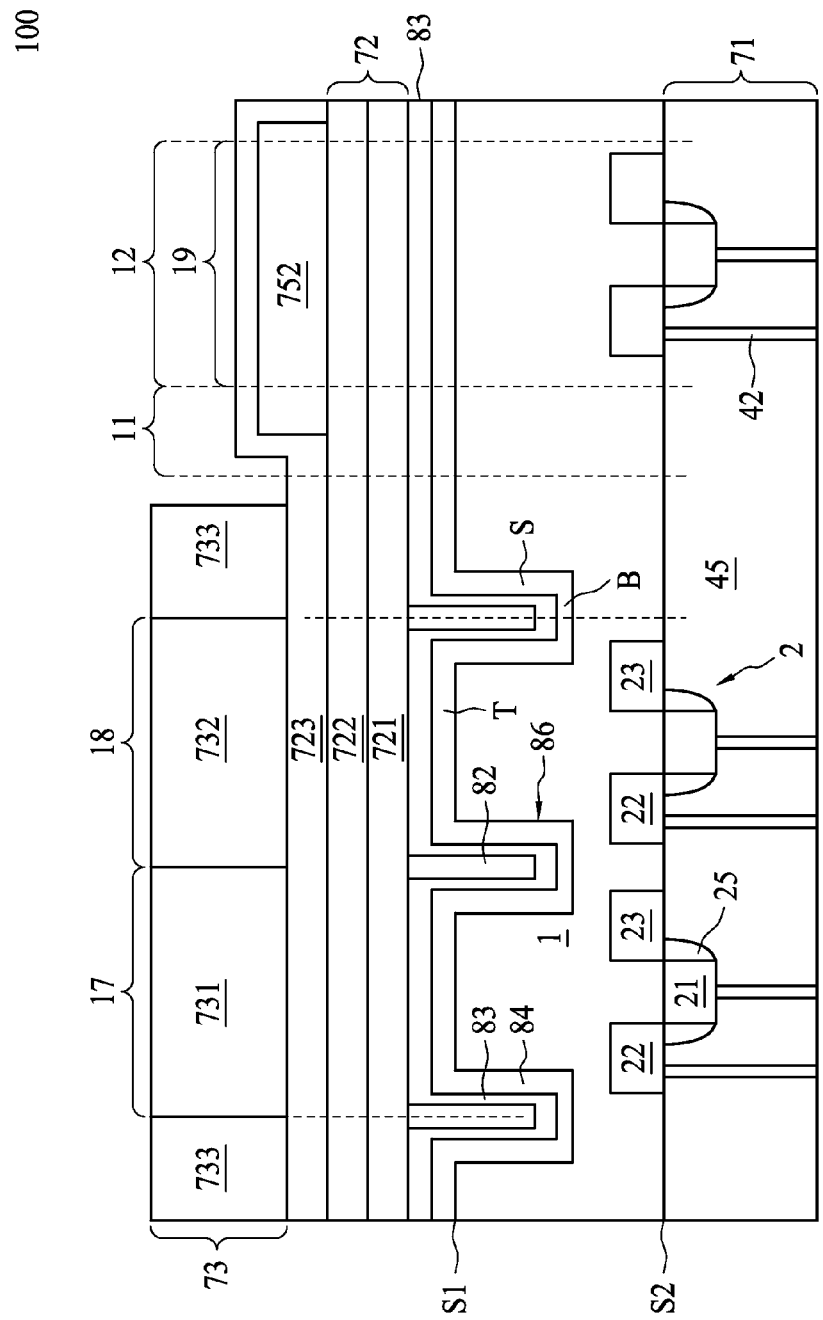

In FIG. 34, a color filter 731 and a color filter 733 are formed sequentially by a similar operation as the operation for forming the color filter 732, except that a different color resist is used. The different color resist is patterned to dispose at a different pixel region such as pixel region 41. The color filter 731 is disposed within pixel 17 adjacent to the color filter 732. Color filters 733 are neighboring with the color filter 732 and the color filter 731.

Color filter array 73 is formed over the capping layer 723. In some embodiments, the color filter array 73 is formed by some suitable method such as a pigment diffusion method using a color resist. In some other embodiments, the color filter array 73 is formed by pigment diffusion method using etching method, dyeing method, or combination thereof.

Some embodiments of the present disclosure provide a back side illuminated (BSI) image sensor. The BSI image sensor includes a semiconductive substrate, a deep trench isolation (DTI) at a back side of the semiconductive substrate, and a dielectric layer. The dielectric layer includes a top portion over the back side, and a side portion lined to a sidewall of the DTI. The BSI image sensor includes a planarization stop layer disposed conformally on top of the dielectric layer. The planarization stop layer includes a top section on the top portion, a side section lined against the side portion, and a first transmittance. The BSI image sensor includes a low-transparent material inside the DTI, and the low-transparent material includes a second transmittance. The second transmittance is lower than the first transmittance.

Some embodiments of the present disclosure provide a back side illuminated (BSI) image sensor. The BSI image sensor includes a semiconductive substrate; a deep trench isolation (DTI) at a back side of the semiconductive substrate; a dielectric layer over the back side and conformally on top of the DTI; a planarization stop layer over the back side and lined against a side portion of the dielectric layer inside the DTI. The planarization stop layer includes a first reflectance. The BSI image sensor includes a low-transparent material within the DTI. The low-transparent material includes a second reflectance. The first reflectance is lower than the second reflectance.

Some embodiments of the present disclosure provide a method of manufacturing a back side illuminated (BSI) image sensor. The method includes receiving a semiconductive substrate; forming a deep trench isolation (DTI) at a back side of the semiconductive substrate; forming a dielectric layer conformally inside the DTI and over the back side of the semiconductive substrate; forming a planarization stop layer conformally over the dielectric layer; forming a conductive material inside the DTI and over the planarization stop layer; planarizing the conductive material; and determining whether the planarization stop layer is exposed based on difference between a first transmittance of the planarization stop layer and a second transmittance of the conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A back side illuminated (BSI) image sensor, comprising:
  a semiconductive substrate, comprising:
    a pixel array region;
    a black level reference pixel array region, for blocking receiving light; and
    a buffer region, disposed between the pixel array region and the black level reference pixel array region;
  a first deep trench isolation (DTI) at the pixel array region of the semiconductive substrate;
  a second DTI at the pixel array region of the semiconductive substrate;
  a dielectric layer comprising:
    a top portion, wherein the top portion is disposed over the pixel array region, the black level reference pixel array region, and the buffer region, and
    a side portion lined to a first sidewall of the first DTI and a second sidewall of the second DTI;
  a planarization stop layer disposed conformally on top of the dielectric layer, and the planarization stop layer comprising:
    a top section on the top portion, wherein the top section is disposed over the pixel array region, the black level reference pixel array region, and the buffer region, and
    a side section lined against the side portion, a material inside the first DTI and the second DTI, and the material is different from the planarization stop layer;
a first transmitting layer, disposed on the planarization stop layer and in contact with the material within the first DTI and the second DTI;
a second transmitting layer, disposed on the first transmitting layer; and
a capping layer, disposed on the second transmitting layer;
wherein the first transmitting layer, the second transmitting layer, and the capping layer are arranged to have increasing refractive index from the capping layer to the first transmitting layer, and the top section of the planarization stop layer is a flat layer extending from the first DTI to the second DTI, and further extending from the second DTI to the buffer region and the black level reference pixel array region.

2. The BSI image sensor of claim 1, wherein the top section of the planarization stop layer is substantially thinner than the top portion of the dielectric layer.

3. The BSI image sensor of claim 1, wherein a top portion of the planarization stop layer is substantially coplanar with a top surface of the material.

4. The BSI image sensor of claim 1, wherein the planarization stop layer and the material are configured to have different optical properties.

5. The BSI image sensor of claim 1, wherein the material comprises tungsten, and the planarization stop layer comprises aluminum oxide.

6. The BSI image sensor of claim 1, wherein the top section of the planarization stop layer is over the semiconductive substrate and the side section of the planarization stop layer inside the first DTI.

7. The BSI image sensor of claim 1, wherein an interface between the top portion of the dielectric layer and the planarization stop layer is a flat interface.

8. The BSI image sensor of claim 1, wherein the first DTI is a multi-layer structure comprising a thermal oxide liner layer with silicon nitride or silicon oxide inside the thermal oxide liner layer.

9. A back side illuminated (BSI) image sensor, comprising:
a semiconductive substrate, comprising:
a pixel array region;
a black level reference pixel array region, for blocking receiving light; and
a buffer region, disposed between the pixel array region and the black level reference pixel array region;
a first deep trench isolation (DTI) at the pixel array region of the semiconductive substrate;
a second DTI at the pixel array region of the semiconductive substrate;
a dielectric layer over the pixel array region, the black level reference pixel array region, and the buffer region, and conformally over the first DTI and the second DTI,
wherein a top portion of the dielectric layer is disposed over the pixel array region, the black level reference pixel array region, and the buffer region;
a planarization stop layer over the pixel array region, the black level reference pixel array region, and the buffer region and lined against a side portion of the dielectric layer inside the first DTI and the second DTI;
a material within the first DTI and the second DTI, wherein
the material is different from the planarization stop layer, and the top portion of the dielectric layer is a flat layer extending from the first DTI to the second DTI, and further extending from the second DTI to the buffer region and the black level reference pixel array region;
a first transmitting layer, disposed on the planarization stop layer and in contact with the material within the first DTI and the second DTI;
a second transmitting layer, disposed on the first transmitting layer; and
a capping layer, disposed on the second transmitting layer;
wherein the first transmitting layer, the second transmitting layer, and the capping layer are arranged to have increasing refractive index from the capping layer to the first transmitting layer.

10. The BSI image sensor of claim 9, wherein the planarization stop layer comprises a bottom section substantially thinner than a bottom portion of the dielectric layer.

11. The BSI image sensor of claim 9, wherein a top section of the planarization stop layer is substantially coplanar with a top surface of the material.

12. The BSI image sensor of claim 9, wherein the planarization stop layer comprises a side section and a bottom section, and the material is in contact with the side section and the bottom section.

13. The BSI image sensor of claim 9, wherein the planarization stop layer comprises a top section in between the first transmitting layer and the top portion of the dielectric layer.

14. The BSI image sensor of claim 9, wherein the planarization stop layer comprises a side section in between the material and the semiconductive substrate.

15. The BSI image sensor of claim 9, wherein the material comprises tungsten.

16. The BSI image sensor of claim 9, wherein the planarization stop layer comprises aluminum oxide.

17. The BSI image sensor of claim 9, wherein an interface between the top portion of the dielectric layer and the planarization stop layer is a flat interface.

18. The BSI image sensor of claim 9, wherein the first DTI is a multi-layer structure comprising a thermal oxide liner layer with silicon nitride or silicon oxide inside the thermal oxide liner layer.

* * * * *